(12) United States Patent
Kitade

(10) Patent No.: US 11,895,929 B2
(45) Date of Patent: Feb. 6, 2024

(54) HALL ELEMENT AND ELECTRONIC COMPONENT

(71) Applicant: ROHM Co., LTD., Kyoto (JP)

(72) Inventor: Tetsuya Kitade, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 34 days.

(21) Appl. No.: 17/321,971

(22) Filed: May 17, 2021

(65) Prior Publication Data

US 2021/0367144 A1 Nov. 25, 2021

(30) Foreign Application Priority Data

May 22, 2020 (JP) ................................. 2020-089885

(51) Int. Cl.
*H10N 52/00* (2023.01)
*G01R 33/07* (2006.01)

(52) U.S. Cl.
CPC ......... *H10N 52/101* (2023.02); *G01R 33/075* (2013.01); *G01R 33/077* (2013.01)

(58) Field of Classification Search
None
See application file for complete search history.

(56) References Cited

U.S. PATENT DOCUMENTS

| | | | | |
|---|---|---|---|---|
| 2006/0097715 | A1* | 5/2006 | Oohira | H01L 27/22 257/E27.005 |
| 2008/0074106 | A1* | 3/2008 | Oohira | G01R 33/077 324/225 |
| 2018/0254407 | A1* | 9/2018 | Hioka | H10N 52/80 |

FOREIGN PATENT DOCUMENTS

| | | |
|---|---|---|
| JP | 2005-259803 | 9/2005 |
| JP | 2007-003237 | 1/2007 |
| JP | 4674578 | 4/2011 |
| JP | 2016-025348 | 2/2016 |

OTHER PUBLICATIONS

Notice of Reasons for Refusal cited in Japanese Application No. 2020089885, dated Dec. 5, 2023.

* cited by examiner

*Primary Examiner* — Nasima Monsur
(74) *Attorney, Agent, or Firm* — CHIP LAW GROUP

(57) ABSTRACT

Provided is a Hall element that detects a magnetic field. The Hall element includes a substrate including a semiconductor region, a first drive electrode arranged on the substrate, a first ground electrode arranged on the substrate separately from the first drive electrode in a first direction, a second ground electrode arranged on the substrate separately from the first drive electrode in a second direction different from the first direction, and a detection electrode group including a first electrode group that detects a Hall voltage generated by a current of components perpendicular to a surface of the substrate, the current flowing from the first drive electrode to the first ground electrode and the second ground electrode.

10 Claims, 19 Drawing Sheets

HALL ELEMENT AND ELECTRONIC COMPONENT

CROSS REFERENCE TO RELATED APPLICATIONS

This application claims priority benefit of Japanese Patent Application No. JP 2020-089885 filed in the Japan Patent Office on May 22, 2020. Each of the above-referenced applications is hereby incorporated herein by reference in its entirety.

BACKGROUND

The present disclosure relates to a Hall element and an electronic component that detect a magnetic field.

A magnetic sensor with what is called a vertical Hall element is disclosed in Japanese Patent No. 4674578. A single-axis magnetic field is detected in the disclosed Hall element.

SUMMARY

In the field of Hall element that detects the magnetic field, there is a demand for a technique of detecting the magnetic field in two directions. However, only the magnetic field in one direction can be detected in the technology described in Japanese Patent No. 4674578, and there is a problem that the magnetic field in two directions may not be detected.

The present disclosure has been made to solve the problem, and it is desirable to detect a magnetic field in two or more directions.

According to an example of the present disclosure, a Hall element detects a magnetic field. The Hall element includes a substrate including a semiconductor region, a first drive electrode arranged on the substrate, a first ground electrode arranged on the substrate separately from the first drive electrode in a first direction, and a second ground electrode arranged on the substrate separately from the first drive electrode in a second direction different from the first direction. The Hall element further includes a detection electrode group including a first electrode group that detects a Hall voltage generated by a current of components perpendicular to a surface of the substrate, the current flowing from the first drive electrode to the first ground electrode and the second ground electrode.

In an example, the Hall element further includes a second drive electrode arranged on the substrate separately from the first ground electrode in the second direction and separately from the second ground electrode in the first direction. The detection electrode group includes a second electrode group that detects a Hall voltage generated by a current of components perpendicular to the surface of the substrate, the current flowing from the second drive electrode to the first ground electrode and the second ground electrode.

In an example, the Hall element further includes a third drive electrode arranged on the substrate, and a third ground electrode arranged separately from the third drive electrode. In the Hall element, the detection electrode group further includes a third electrode group that detects a Hall voltage generated by a current of components parallel to the surface of the substrate, the current flowing from the third drive electrode to the third ground electrode in the substrate.

In an example, the Hall element further includes a first insulation layer formed in a perpendicular direction from the surface of the substrate and formed between the first drive electrode and the first ground electrode of the substrate and between the first drive electrode and the second ground electrode of the substrate.

In an example, the Hall element further includes a second insulation layer formed in the perpendicular direction from the surface of the substrate and formed between the first drive electrode and an electrode of the substrate, the electrode being included in the detection electrode group and being arranged adjacent to the first drive electrode. A depth of the second insulation layer from the surface of the substrate is shallower than a depth of the first insulation layer from the surface of the substrate.

In an example, the substrate is rectangular in plan view of the substrate from a normal direction. The Hall element further includes a third insulation layer formed in the perpendicular direction from the surface of the substrate and formed at four corners of the substrate.

In an example, the third insulation layer at each corner is curved in a circumferential direction of the Hall element.

According to another example of the present disclosure, an electronic component includes the Hall element according to any one of the examples, and a control circuit that controls the Hall element.

According to another example of the present disclosure, an electronic component includes a Hall element formed on a substrate including a semiconductor region, and a control circuit that detects a magnetic field acting on the Hall element. The Hall element includes a first electrode, a second electrode arranged separately from the first electrode in a first direction, a third electrode arranged separately from the first electrode in a second direction orthogonal to the first direction, a fourth electrode arranged separately from the second electrode in the second direction and arranged separately from the third electrode in the first direction, and a detection electrode group. The detection electrode group detects a Hall voltage generated in a first state in which a current of components perpendicular to a surface of the substrate flows from the first electrode to the second electrode and the third electrode and in which a current of components perpendicular to the surface of the substrate flows from the fourth electrode to the second electrode and the third electrode. The detection electrode group also detects a Hall voltage generated in a second state in which a current of components perpendicular to the surface of the substrate flows from the second electrode to the first electrode and the fourth electrode and in which a current of components perpendicular to the surface of the substrate flows from the third electrode to the first electrode and the fourth electrode. The control circuit detects a magnetic field acting on the Hall element, based on a difference between the Hall voltage detected in the first state and the Hall voltage detected in the second state.

According to another example of the present disclosure, an electronic component includes a first Hall element and a second Hall element formed on a substrate including a semiconductor region, and a control circuit that detects a magnetic field acting on the first Hall element and the second Hall element. The first Hall element includes a first drive electrode, a second drive electrode, a first ground electrode arranged separately from the first drive electrode in a first direction and arranged separately from the second drive electrode in a second direction different from the first direction, a second ground electrode arranged separately from the first drive electrode in the second direction and arranged separately from the second drive electrode in the first direction, and a first electrode group that detects a Hall voltage generated in a state in which a current of components perpendicular to a surface of the substrate flows from the first drive electrode to the first ground electrode and the second ground electrode and in which a current of components perpendicular to the surface of the substrate flows from the second drive electrode to the first ground electrode and the second ground electrode. The second Hall element includes a third drive electrode, a fourth drive electrode, a third ground electrode arranged separately from the third drive electrode in the second direction and arranged separately from the third drive electrode in the first direction, a fourth ground electrode arranged separately from the third drive electrode in the first direction and arranged separately from the fourth drive electrode in the second direction, and a second electrode group that detects a Hall voltage generated in a state in which a current of components perpendicular to the surface of the substrate flows from the third drive electrode to the third ground electrode and the fourth ground electrode and in which a current of components perpendicular to the surface of the substrate flows from the fourth drive electrode to the third ground electrode and the fourth ground electrode. The control circuit detects a magnetic field acting on the first Hall element and the second Hall element, based on a difference between the Hall voltage detected by the first electrode group and the Hall voltage detected by the second electrode group.

According to the present disclosure, the magnetic field in two directions can be detected by detecting the Hall voltage generated by the current of the components perpendicular to the surface of the substrate, the current flowing from one electrode to two electrodes.

DETAILED DESCRIPTION OF THE PREFERRED EMBODIMENTS

Figure 1:
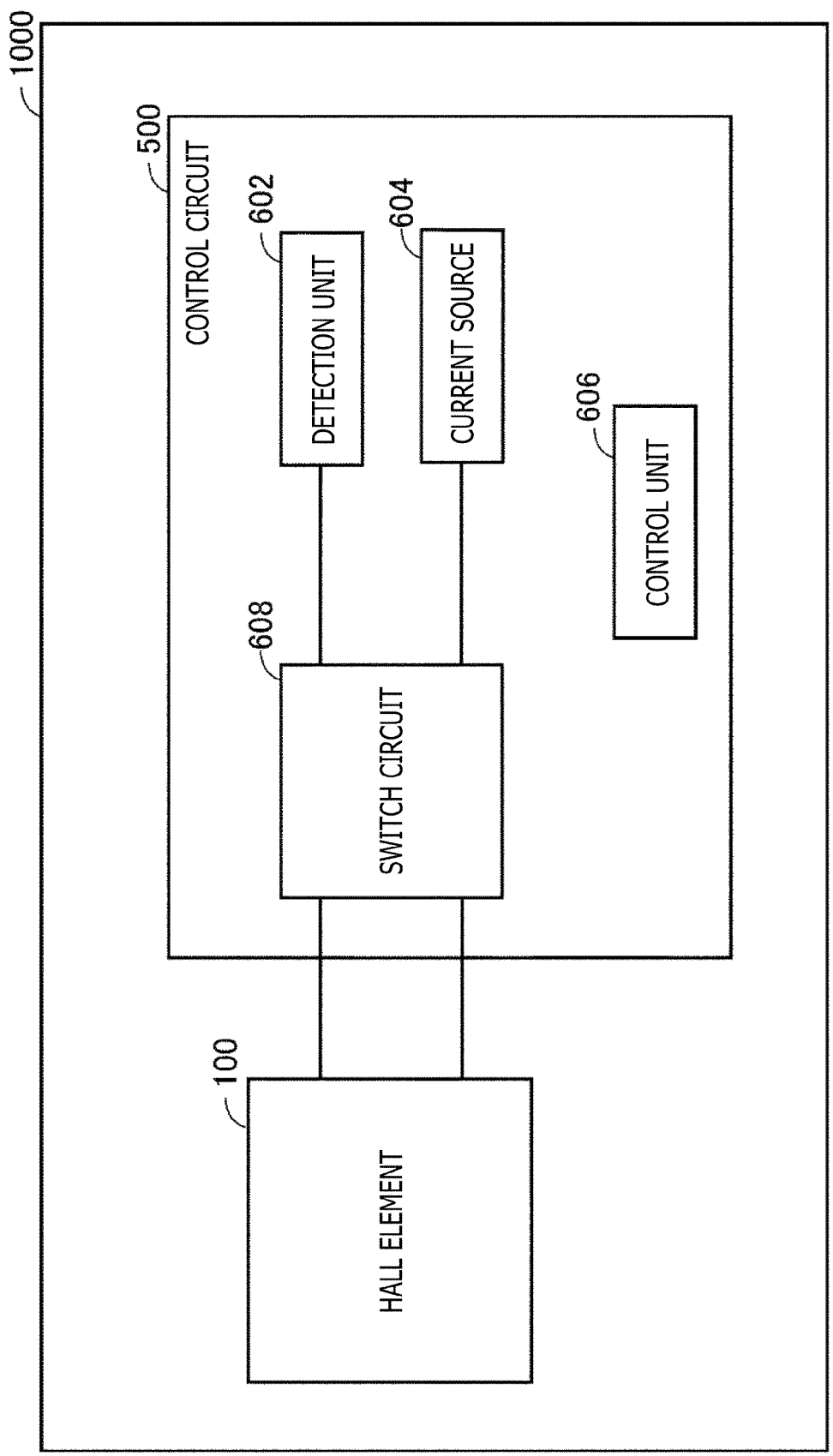
FIG. 1 is a configuration example of a magnetic sensor according to a present embodiment.

Embodiments of the present disclosure will now be described in detail with reference to the drawings. Note that the same reference signs are provided to the same or corresponding parts in the drawings, and the description thereof will not be repeated.

First Embodiment

[Configuration of Magnetic Sensor]
FIG. 1 is a configuration example of a magnetic sensor 1000 to which a Hall element according to a present embodiment is applied. The magnetic sensor 1000 includes a control circuit 500 in addition to a Hall element 100. The control circuit 500 includes a detection unit 602, a current source 604, a control unit 606, and a switch circuit 608. The control unit 606 controls respective constituent parts of the control circuit 500. The detection unit 602 detects a magnetic field. The switch circuit 608 is not used in the present embodiment, and the switch circuit 608 will be described in embodiments described later. Therefore, the control circuit 500 of the present embodiment may not include the switch circuit 608. The Hall element 100 of the present embodiment is what is called a vertical Hall element, and the Hall element 100 uses a current flowing in a direction perpendicular to the surface of a semiconductor substrate provided with the Hall element 100, to detect the magnetic field. The Hall element 100 outputs a Hall voltage corresponding to the magnetic field acting on the Hall element. The detection unit 602 detects the magnetic field acting on the Hall element 100, based on the Hall voltage output from the Hall element 100. In addition, the current source 604 supplies the Hall element 100 with a drive current to generate the Hall voltage in the Hall element 100, under the control of the control unit 606. Note that the control circuit 500 may include a voltage source in place of the current source 604. The voltage source supplies the Hall element 100 with a drive voltage to generate the Hall voltage in the Hall element 100.

The existing vertical Hall element can detect only the magnetic field in one direction. On the other hand, in the field of Hall element that detects the magnetic field, there is a demand for a technique of detecting the magnetic field in two or more directions. To detect the magnetic field in two or more directions, the magnetic sensor can include two Hall elements that each detect only a single-axis magnetic field. However, this configuration increases the size of the magnetic sensor. Therefore, two sets of electrodes (first drive electrode 101, second drive electrode 102, first ground electrode 151, and second ground electrode 152 described later) used for supplying the drive current are arranged in the Hall element 100 of the present embodiment as described below. In such a manner, respective Hall voltages corresponding to the magnetic field in two directions (X-axis and Y-axis in the present embodiment) are detected. Therefore, the Hall element can downsize the magnetic sensor while detecting the magnetic field in two directions based on the Hall voltages. Note that the second drive electrode 102 may not be included.

[Configuration of Hall Element 100]

Figure 2:
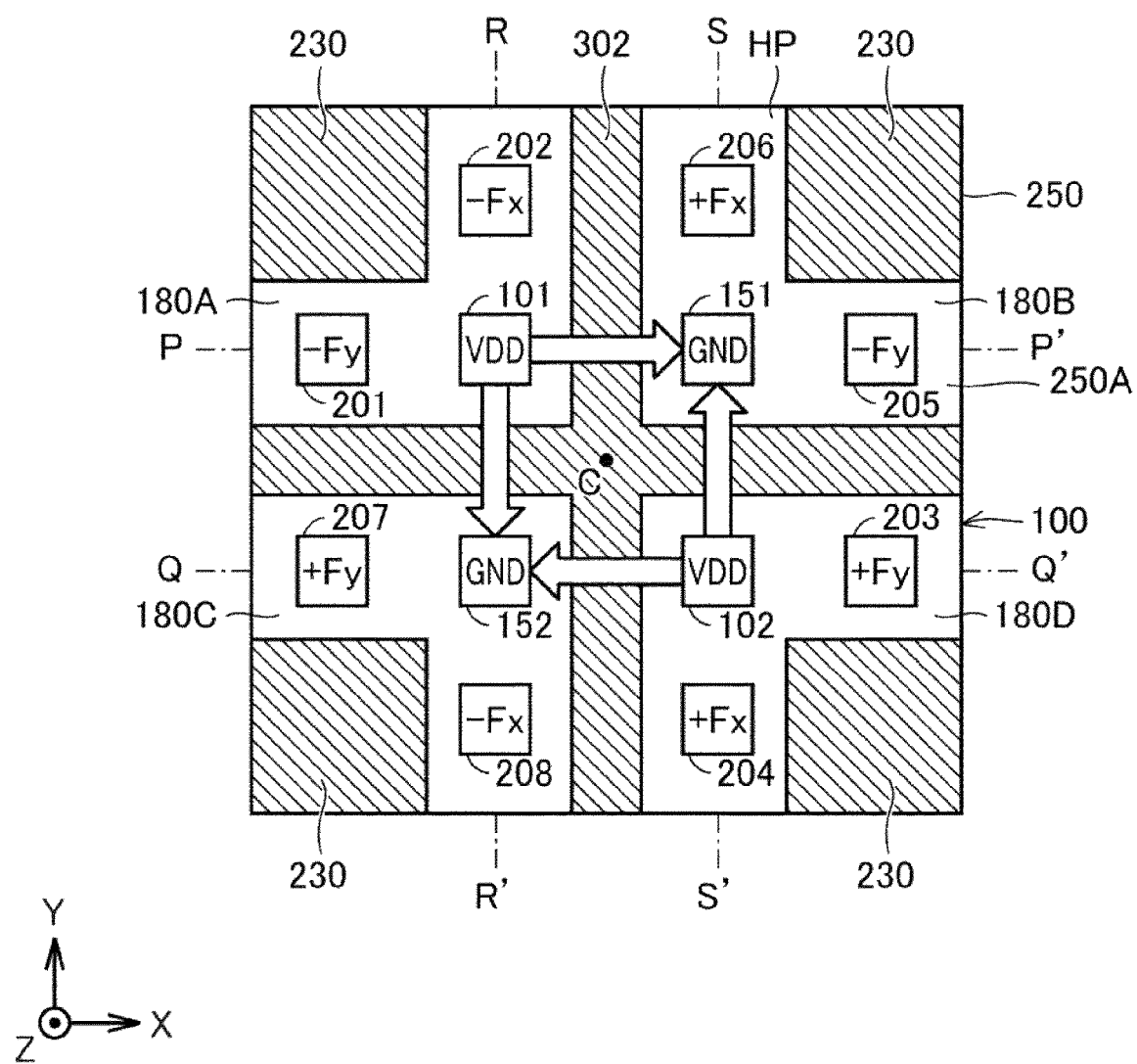
FIG. 2 is a plan view of a Hall element according to the present embodiment from a Z-axis direction.
Figure 3A:
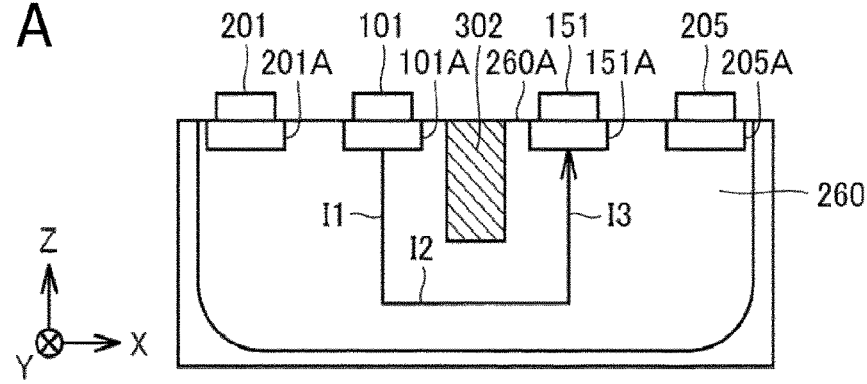
FIGS. 3A to 3D are cross-sectional views of the Hall element according to the present embodiment.
Figure 3B:
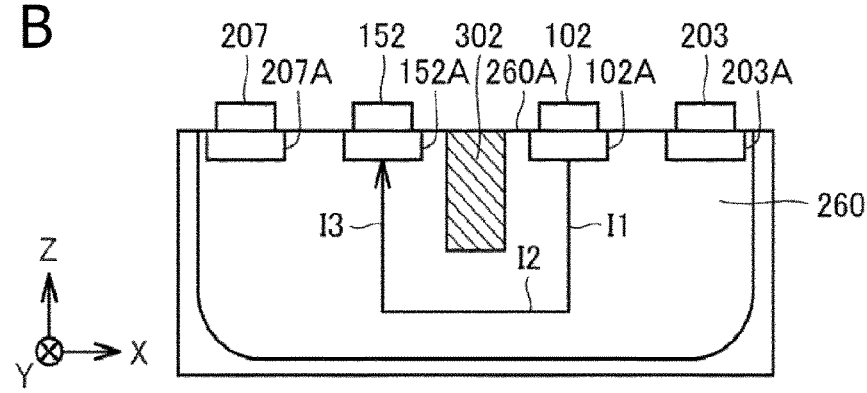
Figure 3C:
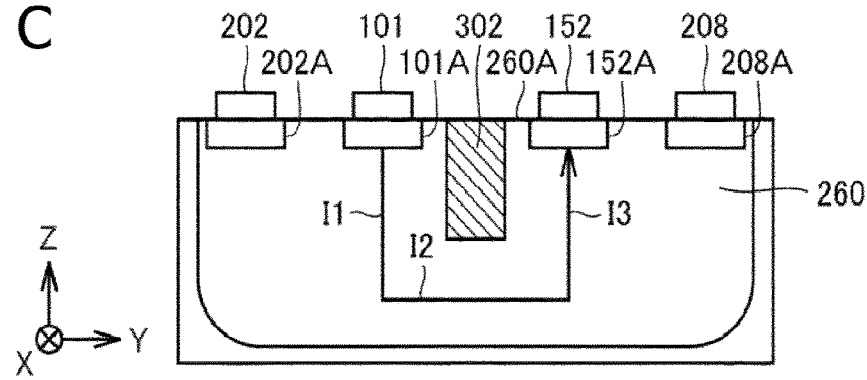
Figure 3D:
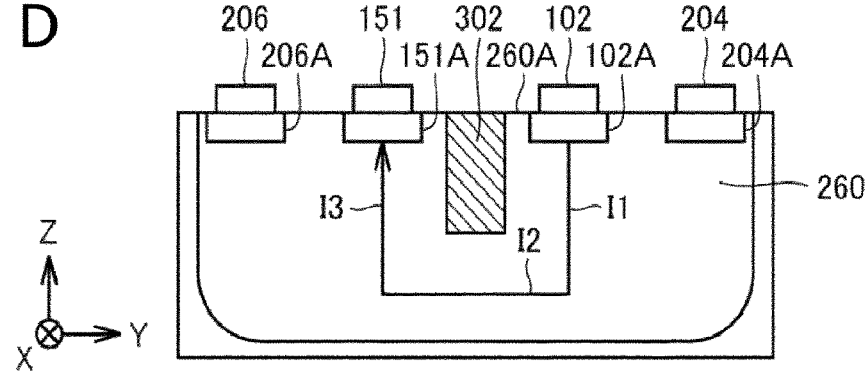

FIG. 2 and FIGS. 3A to 3D depict a configuration example of the Hall element 100. A schematic structure of the Hall element 100 according to the embodiment will be described with reference to FIG. 2 and FIGS. 3A to 3D. In the drawings of the present embodiment, the axis in the thickness direction of the Hall element 100 will be referred to as a Z-axis. The Z-axis is also an axis in a normal direction of a surface 250A of a semiconductor substrate 250 described later. In addition, the axes orthogonal to the Z-axis will be referred to as an X-axis and a Y-axis. The X-axis direction corresponds to a "first direction" in the embodiment of the present disclosure. The Y-axis direction corresponds to a "second direction" in the embodiment of the present disclosure. FIG. 2 is a plan view of the Hall element 100 from the Z-axis direction. In the example of FIG. 2, the Hall element 100 is rectangular, more specifically, square. FIG. 3A is a cross-sectional view along a line P-P' in FIG. 2. FIG. 3B is a cross-sectional view along a line Q-Q' in FIG. 2. FIG. 3C is a cross-sectional view along a line R-R' in FIG. 2. FIG. 3D is a cross-sectional view along a line S-S' in FIG. 2.

As illustrated in FIG. 2, the Hall element 100 includes the semiconductor substrate 250. As illustrated in FIGS. 3A to 3D, the semiconductor substrate 250 includes a semiconductor region 260 (N-well). The semiconductor substrate 250 is, for example, a P-type silicon substrate (P-sub). Further, N-type conductive impurities are introduced to the surface 250A of the semiconductor substrate 250, and the semiconductor region 260 is formed as a diffusion layer (well). The semiconductor region 260 is formed such that the semiconductor region 260 is surrounded by the semiconductor substrate 250.

A P-type diffusion layer (not illustrated) used for isolating the Hall element 100 from other elements is formed at the periphery of the Hall element 100. A P-type diffusion layer 230 is further formed at four corners of the Hall element 100. The diffusion layer 230 corresponds to a "third insulation layer" in the embodiment of the present disclosure. As illustrated in FIGS. 3A to 3D, twelve contact regions 101A, 102A, 151A, 152A, and 201A to 208A (N+ diffusion layer) are formed in regions (active regions) surrounded by the diffusion layer 230 on a surface 260A of the semiconductor region 260, so as to increase the impurity concentration (N-type) of the surface. Further, twelve electrodes (electrodes 101, 102, 151, 152, and 201 to 208 in the example of FIG. 2 and FIGS. 3A to 3D) are formed in the respective twelve contact regions. Favorable ohmic contacts are formed by the twelve contact regions and the twelve electrodes formed in the respective twelve contact regions.

In addition, the Hall element 100 is divided into four regions 180A to 180D through pn junction isolation by a diffusion layer 302 in a cross shape as illustrated in FIG. 2. The diffusion layer 302 corresponds to a "first insulation layer" of the present embodiment. The diffusion depth of the diffusion layer 302 is shallower than the diffusion depth of the semiconductor region 260. As illustrated in FIGS. 3A to 3D, the diffusion layer 302 forms a current path in the semiconductor region 260. A region that is electrically divided inside of the semiconductor substrate 250 is also formed in each of the four regions 180A to 180D. The formed regions provide a magnetic detection unit HP (Hall plate) that can detect the magnetic field. In the example of FIG. 2, unhatched parts in the Hall element 100 provide the magnetic detection unit.

The twelve electrodes 101, 102, 151, 152, and 201 to 208 of the present embodiment will be described below. The Hall element 100 includes twelve electrodes including a first drive electrode 101, a second drive electrode 102, a first ground electrode 151, a second ground electrode 152, a first detection electrode 201, a second detection electrode 202, a third detection electrode 203, a fourth detection electrode 204, a fifth detection electrode 205, a sixth detection electrode 206, a seventh detection electrode 207, and an eighth detection electrode 208. The first detection electrode 201, the second detection electrode 202, the third detection electrode 203, the fourth detection electrode 204, the fifth detection electrode 205, the sixth detection electrode 206, the seventh detection electrode 207, and the eighth detection electrode 208 will also comprehensively be referred to as a "detection electrode group."

The first drive electrode 101 and the second drive electrode 102 are electrodes that receive the drive current from the current source 604 under the control of the control unit 606. The first ground electrode 151 and the second ground electrode 152 are electrodes with ground potential. The detection electrode group includes electrodes that detect Hall voltages produced by the generated magnetic field.

Note that, in the example of the drawings (for example, FIG. 2) of the present application, the first drive electrode 101 and the second drive electrode 102 are indicated by "VDD." In addition, the first ground electrode 151 and the second ground electrode 152 are indicated by "GND." Further, +Fx indicates that a positive Hall voltage corresponding to the magnetic field in the X-axis direction is detected. −Fx indicates that a negative Hall voltage corresponding to the magnetic field in the X-axis direction is detected. +Fy indicates that a positive Hall voltage corresponding to the magnetic field in the Y-axis direction is detected. −Fy indicates that a negative Hall voltage corresponding to the magnetic field in the Y-axis direction is detected. In the present specification, the positive Hall voltage is a voltage in which the direction of the Lorentz force corresponding to the Hall voltage is a direction toward the detection electrode that detects the Hall voltage. The negative Hall voltage is a voltage in which the direction of the Lorentz force corresponding to the Hall voltage is a direction away from the detection electrode that detects the Hall voltage. Further, thick arrows in the drawings of the present application indicate flows of the drive current.

The first drive electrode 101, the first detection electrode 201, and the second detection electrode 202 are formed in the region 180A. The first ground electrode 151, the fifth detection electrode 205, and the sixth detection electrode 206 are formed in the region 180B. The second ground electrode 152, the seventh detection electrode 207, and the eighth detection electrode 208 are formed in the region 180C. The second drive electrode 102, the third detection electrode 203, and the fourth detection electrode 204 are formed in the region 180D.

Also, each set of the first drive electrode 101 and the second drive electrode 102, the first ground electrode 151 and the second ground electrode 152, the first detection electrode 201 and the third detection electrode 203, the second detection electrode 202 and the fourth detection electrode 204, the fifth detection electrode 205 and the seventh detection electrode 207, and the sixth detection electrode 206 and the eighth detection electrode 208 is at positions point-symmetric with respect to a center of gravity C.

The first ground electrode 151 is arranged separately in the positive direction of the X-axis of the first drive electrode 101. The second ground electrode 152 is arranged separately in the negative direction of the Y-axis of the first drive electrode 101. The second drive electrode 102 is arranged separately in the negative direction of the Y-axis of the first ground electrode 151 and the positive direction of the X-axis of the second ground electrode 152.

Further, the first detection electrode 201 is arranged separately in the negative direction of the X-axis of the first drive electrode 101. The second detection electrode 202 is arranged separately in the positive direction of the Y-axis of the first drive electrode 101. The third detection electrode 203 is arranged separately in the positive direction of the X-axis of the second drive electrode 102. The fourth detection electrode 204 is arranged separately in the negative direction of the Y-axis of the second drive electrode 102. The fifth detection electrode 205 is arranged separately in the positive direction of the X-axis of the first ground electrode 151. The sixth detection electrode 206 is arranged separately in the positive direction of the Y-axis of the first ground electrode 151. The seventh detection electrode 207 is arranged separately in the negative direction of the X-axis of the second ground electrode 152. The eighth detection electrode 208 is arranged separately in the negative direction of the Y-axis of the second ground electrode 152.

Figure 4:
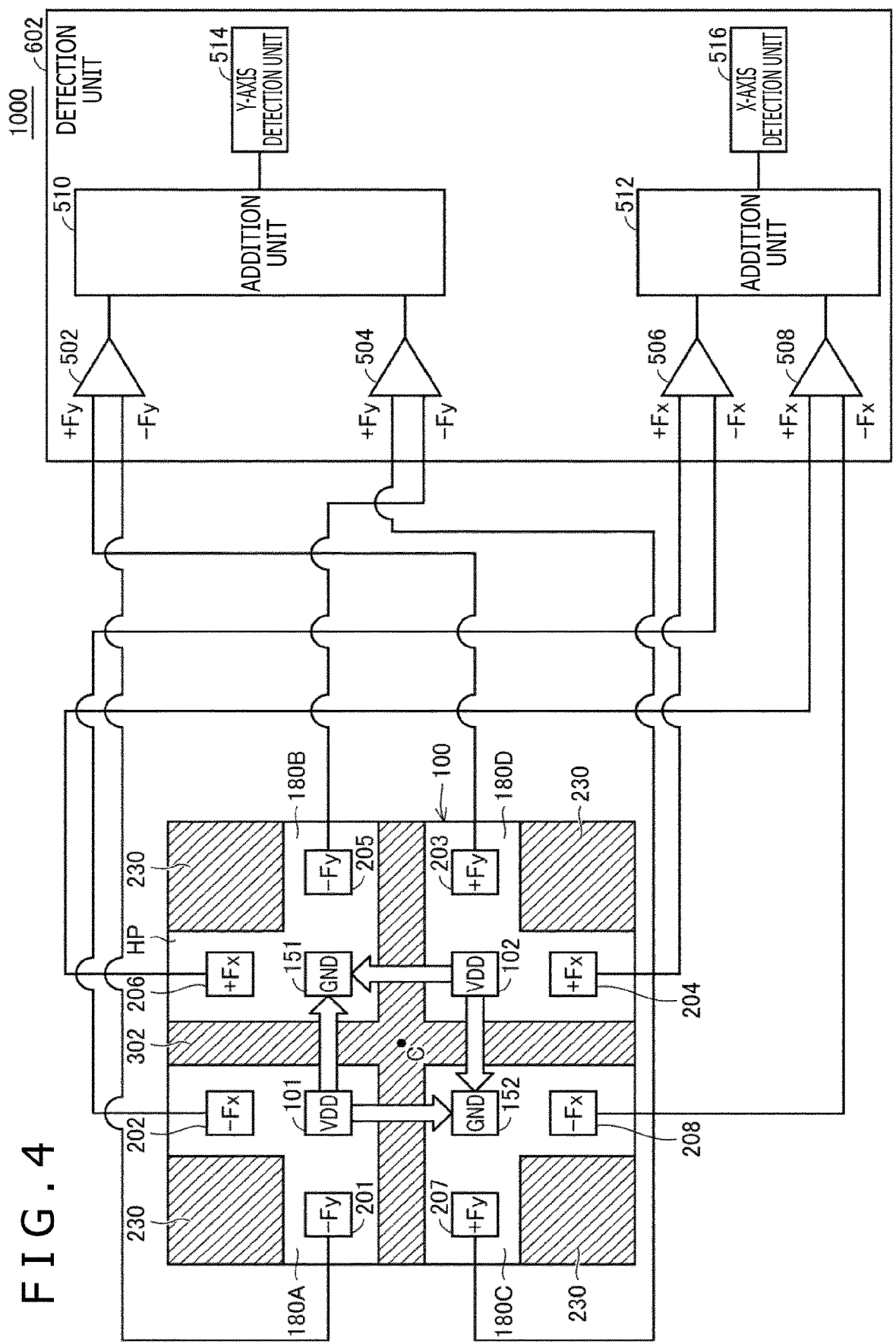
FIG. 4 depicts the Hall element and a control circuit according to the present embodiment.

FIG. 4 is a diagram for describing a connection relation of wiring between the Hall element 100 and the detection unit 602. The detection unit 602 includes amplifiers 502, 504, 506, and 508, addition units 510 and 512, a Y-axis detection unit 514, and an X-axis detection unit 516.

The first detection electrode 201 and the third detection electrode 203 are connected to the amplifier 502. The fifth detection electrode 205 and the seventh detection electrode 207 are connected to the amplifier 504. The second detection electrode 202 and the fourth detection electrode 204 are connected to the amplifier 506. The sixth detection electrode 206 and the eighth detection electrode 208 are connected to the amplifier 508.

As illustrated in FIGS. 3A and 3C, when the drive current is supplied to the first drive electrode 101, the drive current flows from the first drive electrode 101 to the first ground electrode 151 and the second ground electrode 152. Here, the diffusion layer 302 is formed in the negative direction of the Z-axis, between the first drive electrode 101 and the first ground electrode 151 and between the first drive electrode 101 and the second ground electrode 152. Therefore, a route I1 in the negative direction of the Z-axis, a route I2 parallel to an XY plane, and a route I3 in the positive direction of the Z-axis are formed as routes of the drive current. The drive current from the first drive electrode 101 to the first ground electrode 151 and the second ground electrode 152 flows in the order of the route I1, the route I2, and the route I3.

As illustrated in FIGS. 3B and 3D, when the drive current is supplied to the second drive electrode 102, the drive current flows from the second drive electrode 102 to the first ground electrode 151 and the second ground electrode 152. Here, the diffusion layer 302 is formed in the negative direction of the Z-axis, between the second drive electrode 102 and the first ground electrode 151 and between the second drive electrode 102 and the second ground electrode 152. Therefore, a route I1 in the negative direction of the Z-axis, a route I2 parallel to the XY plane, and a route I3 in the positive direction of the Z-axis are formed as routes of the drive current. The drive current from the second drive electrode 102 to the first ground electrode 151 and the second ground electrode 152 flows in the order of the route I1, the route I2, and the route I3.

As illustrated in FIG. 3A, when the magnetic field in the positive direction of the Y-axis is generated, a negative Hall voltage (−Fy) is detected by the first detection electrode 201 due to a Hall effect based on the magnetic field in the Y-axis direction and the drive current in the route I1. Further, when the magnetic field in the positive direction of the Y-axis is generated, a negative Hall voltage (−Fy) is detected by the fifth detection electrode 205 due to a Hall effect based on the magnetic field in the Y-axis direction and the drive current in the route I3.

As illustrated in FIG. 3B, when the magnetic field in the positive direction of the Y-axis is generated, a positive Hall voltage (+Fy) is detected by the seventh detection electrode 207 due to a Hall effect based on the magnetic field in the Y-axis direction and the drive current in the route I3. Further, when the magnetic field in the positive direction of the Y-axis is generated, a positive Hall voltage (+Fy) is detected by the third detection electrode 203 due to a Hall effect based on the magnetic field in the Y-axis direction and the drive current in the route I1.

As illustrated in FIG. 3C, when the magnetic field in the positive direction of the X-axis is generated, a negative Hall voltage (−Fx) is detected by the second detection electrode 202 due to a Hall effect based on the magnetic field in the X-axis direction and the drive current in the route I1. Further, when the magnetic field in the positive direction of the X-axis is generated, a negative Hall voltage (−Fx) is detected by the eighth detection electrode 208 due to a Hall effect based on the magnetic field in the X-axis direction and the drive current in the route I3.

As illustrated in FIG. 3D, when the magnetic field in the positive direction of the X-axis is generated, a positive Hall voltage (+Fx) is detected by the sixth detection electrode 206 due to a Hall effect based on the magnetic field in the X-axis direction and the drive current in the route I3. Further, when the magnetic field in the positive direction of the X-axis is generated, a positive Hall voltage (+Fx) is detected by the fourth detection electrode 204 due to a Hall effect based on the magnetic field in the X-axis direction and the drive current in the route I1.

As illustrated in FIG. 4, the amplifier 502 amplifies the Hall voltages detected by the first detection electrode 201 and the third detection electrode 203 (Hall voltages corresponding to the magnetic field in the Y-axis direction). The amplifier 504 amplifies the Hall voltages detected by the fifth detection electrode 205 and the seventh detection electrode 207 (Hall voltages corresponding to the magnetic field in the Y-axis direction). The amplifier 506 amplifies the Hall voltages detected by the second detection electrode 202 and the fourth detection electrode 204 (Hall voltages corresponding to the magnetic field in the X-axis direction). The amplifier 508 amplifies the Hall voltages detected by the sixth detection electrode 206 and the eighth detection electrode 208 (Hall voltages corresponding to the magnetic field in the X-axis direction).

The addition unit 510 adds the Hall voltage value amplified by the amplifier 502 (Hall voltage value corresponding to the magnetic field in the Y-axis direction) and the Hall voltage value amplified by the amplifier 504 (Hall voltage value corresponding to the magnetic field in the Y-axis direction). The Y-axis detection unit 514 detects the magnetic field of the Y-axis based on the Hall voltage value added by the addition unit 510.

The addition unit 512 adds the Hall voltage value amplified by the amplifier 506 (Hall voltage value corresponding to the magnetic field in the X-axis direction) and the Hall voltage value amplified by the amplifier 508 (Hall voltage value corresponding to the magnetic field in the X-axis direction). The X-axis detection unit 516 detects the magnetic field of the X-axis based on the Hall voltage value added by the addition unit 512.

As described above, the Hall element 100 of the present embodiment includes two sets of electrodes (first drive electrode 101, second drive electrode 102, first ground electrode 151, and second ground electrode 152) used for suppling the drive current. In a first electrode group (first detection electrode 201, second detection electrode 202, fifth detection electrode 205, and eighth detection electrode 208 in the present embodiment) that is part of the detection electrode group, the Hall voltages are generated according to the magnetic field, in the state in which the drive current flows from the first drive electrode 101 to the first ground electrode 151 and the second ground electrode 152. As described in FIG. 3A, the Y-axis detection unit 514 uses the Hall voltage based on the drive current flowing from the first drive electrode 101 to the first ground electrode 151, to detect the magnetic field in the Y-axis direction. In addition, as described in FIG. 3C, the X-axis detection unit 516 uses the Hall voltage based on the drive current flowing from the first drive electrode 101 to the second ground electrode 152, to detect the magnetic field in the X-axis direction. Therefore, the Hall element 100 of the present embodiment can detect the magnetic field in two directions.

Further, in a second detection electrode group (third detection electrode 203, fourth detection electrode 204, sixth detection electrode 206, and seventh detection electrode 207) that is part of the detection electrode group, the Hall voltages are generated according to the magnetic field, in the state in which the drive current flows from the second drive electrode 102 to the first ground electrode 151 and the second ground electrode 152. As described in FIG. 3B, the Y-axis detection unit 514 uses the Hall voltage based on the drive current flowing from the second drive electrode 102 to the first ground electrode 151, to detect the magnetic field in the Y-axis direction. As described in FIG. 3D, the X-axis detection unit 516 uses the Hall voltage based on the drive current flowing from the second drive electrode 102 to the first ground electrode 151, to detect the magnetic field in the X-axis direction. Therefore, the Hall voltage value corresponding to the magnetic field in the X-axis direction and the Hall voltage value corresponding to the magnetic field in the Y-axis direction can be increased compared to the Hall element not including the second drive electrode 102. This can improve the accuracy (sensitivity) of the detection of the magnetic field in the X-axis direction and the Y-axis direction.

Further, as described in FIG. 2, the diffusion layer 230 is formed at four corners of the Hall element 100. The diffusion layer 230 can cause the carriers moved by the Hall effect to stay at the magnetic detection unit, and the detection accuracy of the magnetic field can be improved.

Second Embodiment

Figure 5:
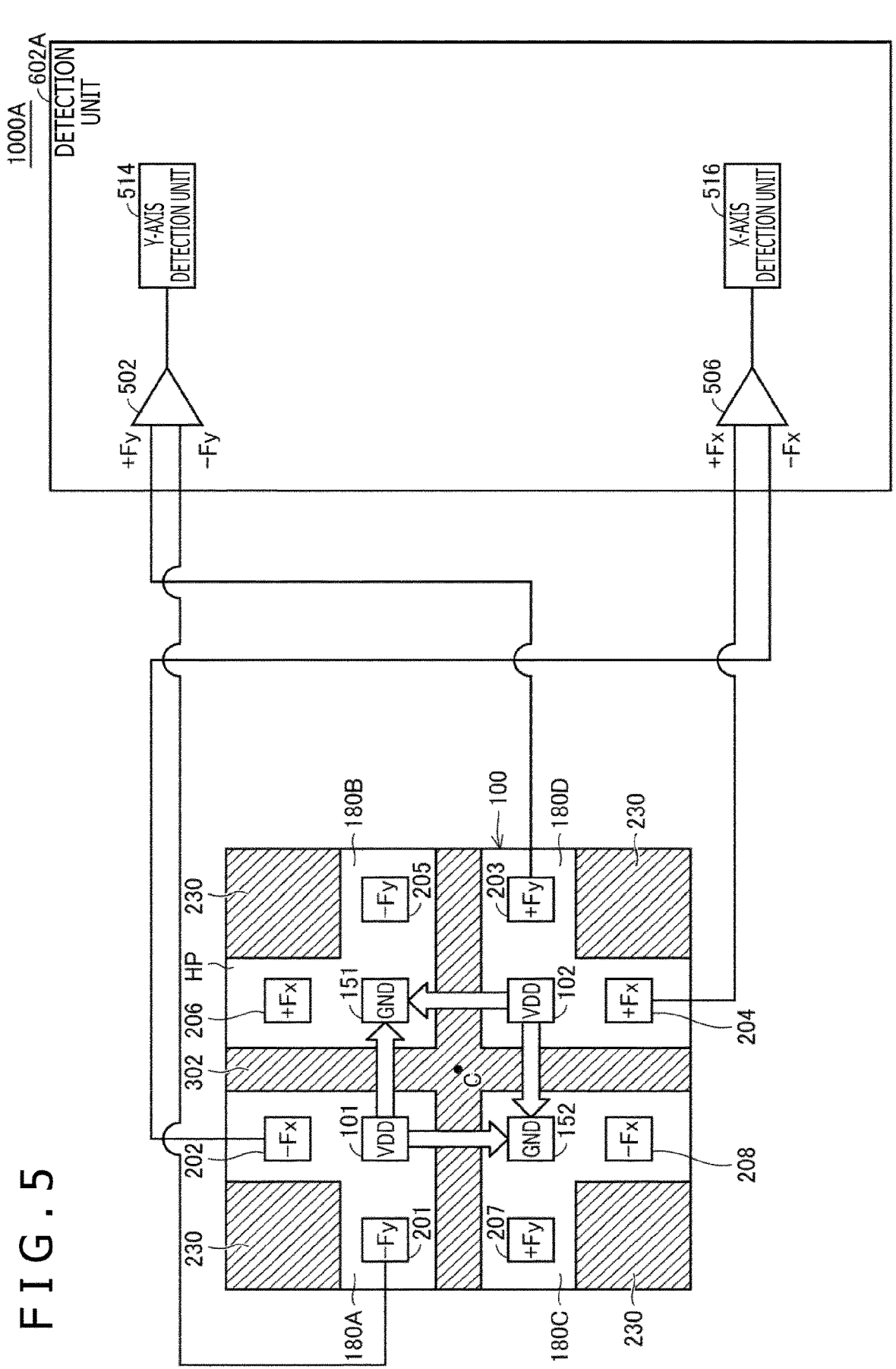
FIG. 5 depicts the Hall element and a control circuit according to another embodiment.

The wiring in the magnetic sensor 1000 of the first embodiment is simplified in a magnetic sensor 1000A of a second embodiment. FIG. 5 is a diagram for describing a connection relation of wiring between the Hall element 100 and a detection unit 602A of the second embodiment. The detection unit 602A includes the amplifiers 502 and 506, the Y-axis detection unit 514, and the X-axis detection unit 516.

The Y-axis detection unit 514 detects the magnetic field of the Y-axis based on the Hall voltage amplified by the amplifier 502 (Hall voltage corresponding to the magnetic field in the Y-axis direction). Further, the X-axis detection unit 516 detects the magnetic field of the X-axis based on the Hall voltage amplified by the amplifier 506 (Hall voltage corresponding to the magnetic field in the X-axis direction).

Although the sensitivity of the magnetic sensor 1000A of the second embodiment is halved compared to the magnetic sensor 1000 of the first embodiment, the wiring of the detection circuit can be simplified, and the manufacturing cost can be reduced. The designer of the magnetic sensor can determine which one of the configuration of the first embodiment and the configuration of the second embodiment is to be adopted, according to the sensitivity suitable for the Hall element and the wiring cost.

Third Embodiment

Figure 6:
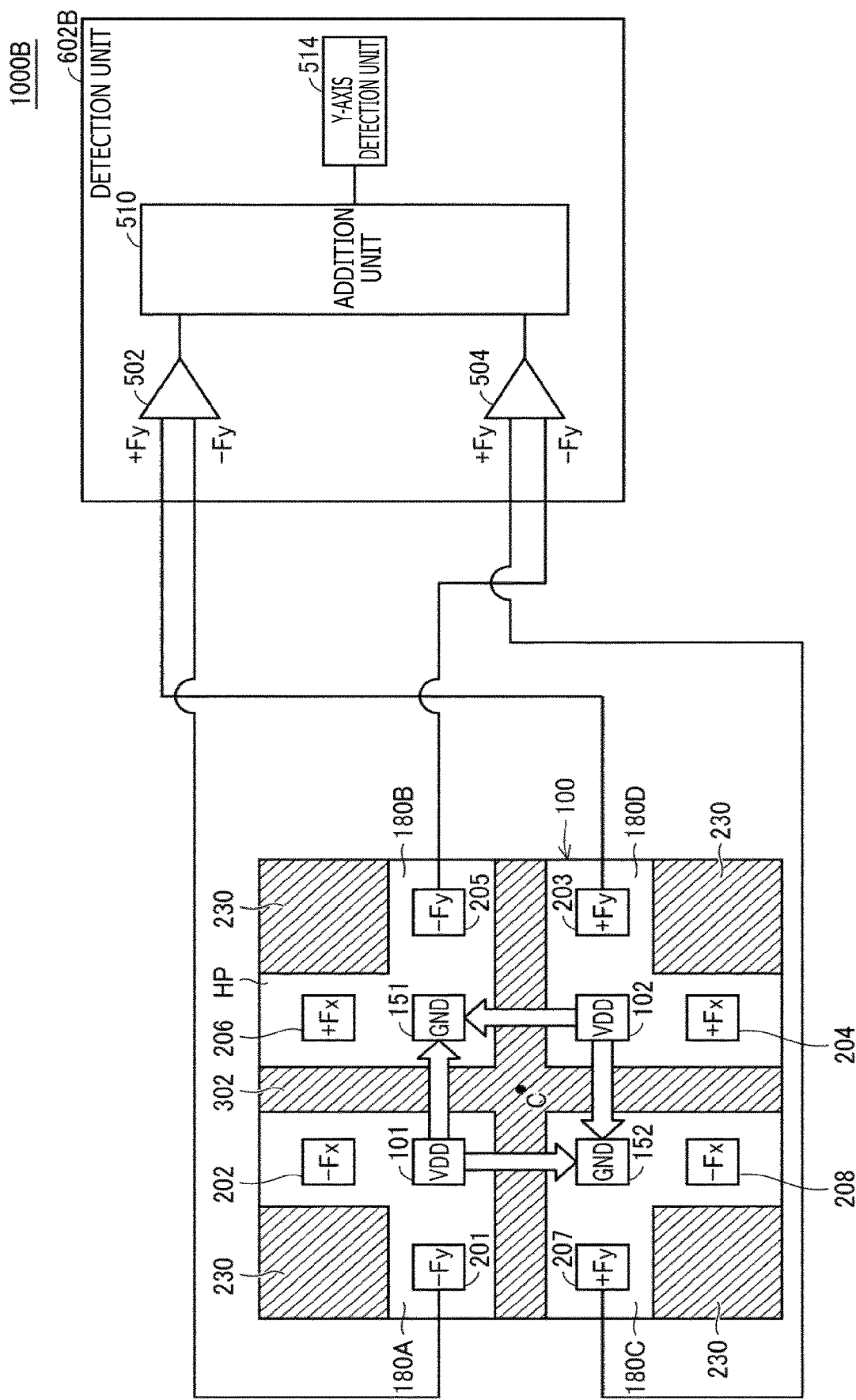
FIG. 6 depicts the Hall element and a control circuit according to another embodiment.

The magnetic detection accuracy in one direction is higher in a magnetic sensor 1000B of a third embodiment than in the existing magnetic sensor. FIG. 6 is a diagram for describing a connection relation of wiring between the Hall element 100 and a detection unit 602B. The detection unit 602B includes the amplifiers 502 and 504, the addition unit 510, and the Y-axis detection unit 514.

While the magnetic sensor 1000 of the first embodiment can detect the magnetic field in two directions, the magnetic accuracy in one direction can be increased in the magnetic sensor 1000B of the third embodiment compared to the magnetic accuracy in the existing magnetic sensor. Therefore, the designer of the magnetic sensor can determine which one of the configuration of the second embodiment and the configuration of the third embodiment is to be adopted, according to whether to detect the magnetic field in two directions or to increase the magnetic detection accuracy in one direction.

Fourth Embodiment

In the configurations described in the embodiments described above, the diffusion layer 230 formed at four corners of the Hall element 100 is rectangular in plan view of the Hall element 100 from the Z-axis direction. A diffusion layer of a fourth embodiment is curved in a circumferential direction of the Hall element.

Figure 7:
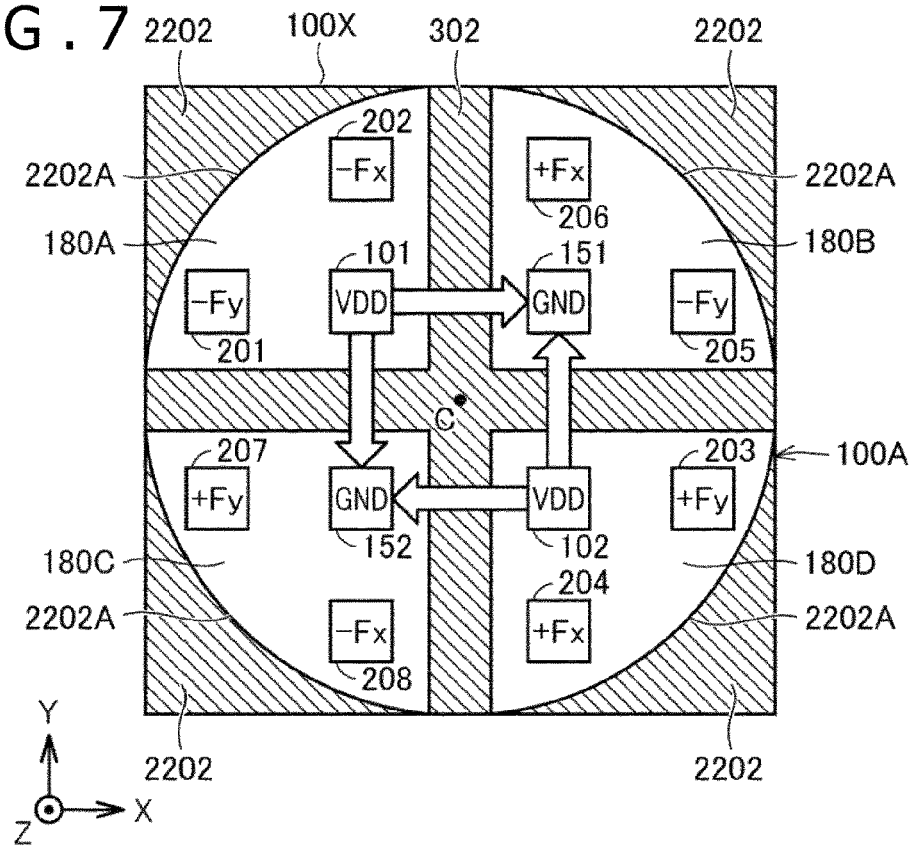
FIG. 7 is a plan view of a Hall element according to another embodiment from the Z-axis direction.

FIG. 7 depicts a configuration example of a Hall element 100A of the fourth embodiment. In the Hall element 100A, a diffusion layer 2202 is formed in place of the diffusion layer 230 formed at four corners. The diffusion layer 2202 includes a curved surface 2202A curved in a direction of a circumference 100X of the Hall element 100A.

When, for example, the carriers moved by the Hall effect hit the vertex of the rectangular diffusion layer 230, the reflection direction is not uniquely determined, and the carriers may not move toward the detection electrode. Consequently, the Hall voltage to be detected may become uncertain, and the detection accuracy may be reduced. As in the present embodiment, the diffusion layer can be formed to include the curved surface 2202A, and the uncertainty in the reflection direction of the carriers can be reduced because the vertex is not formed. Therefore, the carriers moved by the Hall effect can be surely moved to near the detection electrode, and as a result, the detection accuracy of the Hall voltage can be improved.

Fifth Embodiment

Figure 8:
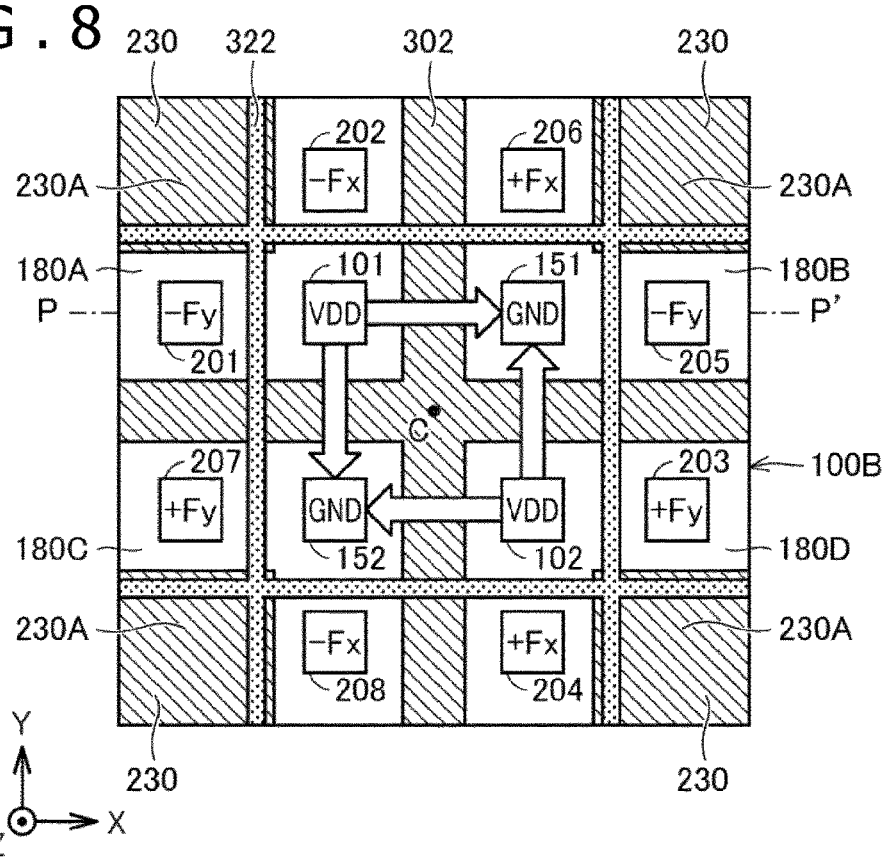
FIG. 8 is a plan view of a Hall element according to another embodiment from the Z-axis direction.
Figure 9:
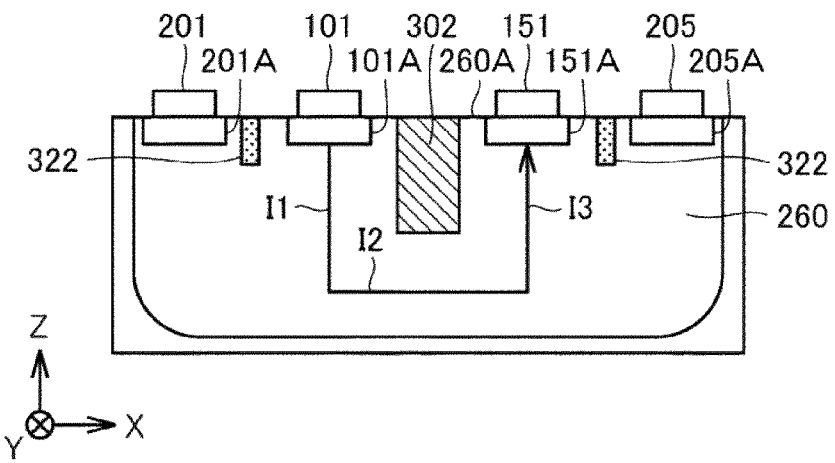
FIG. 9 is a cross-sectional view of the Hall element according to the other embodiment.

In the embodiments described above, part of the current supplied to the drive electrode may be transmitted through the surface of the diffusion layer 302 and leaked to the detection electrode. In this case, the amount of drive current flowing from the drive electrode to the ground electrode decreases, and the detection accuracy may be reduced. In a fifth embodiment, a diffusion layer shallower than the diffusion layer 302 is provided to prevent the reduction in the detection accuracy. FIG. 8 is a configuration diagram of a Hall element 100B of the fifth embodiment. FIG. 9 is a cross-sectional view along the line P-P' in FIG. 8. As illustrated in FIGS. 8 and 9, the Hall element of the fifth embodiment includes a diffusion layer 322 in addition to the diffusion layer 302. The diffusion layer 322 corresponds to a "second insulation layer" in the embodiment of the present disclosure. Hereinafter, the first drive electrode 101, the second drive electrode 102, the first ground electrode 151, and the second ground electrode 152 will comprehensively be referred to as a "drive electrode group" in some cases.

The diffusion layer 322 is formed between at least one of the plurality of detection electrodes (first detection electrode 201 to eighth detection electrode 208) included in the detection electrode group and the electrodes of the drive electrode group. In the example of FIG. 8, the diffusion layer 322 is formed between each electrode of the detection electrode group and each electrode of the drive electrode group. As illustrated in FIG. 9, the diffusion layer 322 is formed in the Z-axis direction. The depth of the diffusion layer 322 in the thickness direction (dimension in the Z-axis direction) is shallower than the depth of the diffusion layer 302 in the thickness direction.

In such a manner, the diffusion layer 322 can be formed to reduce the amount of current transmitted through the surface of the diffusion layer 302. This can prevent the decrease in the amount of drive current flowing from the drive electrode to the ground electrode. In addition, the diffusion layer 322 is shallower than the diffusion layer 302, and the carriers affected by the Hall effect can be moved to each electrode of the detection electrode group. In such a manner, the reduction in the detection accuracy can be prevented in the Hall element of the present embodiment.

Sixth Embodiment

It is preferable that the electrodes of the drive electrode group and the detection electrode group be arranged such that the electrodes are completely symmetric with respect to the center of gravity C (see FIG. 2). However, there are, for example, mispositions (misalignments) caused by errors related to the arrangement positions of the electrodes of the drive electrode group and the detection electrode group, and the voltage detected by the detection electrode group includes an offset voltage (unbalanced voltage) in addition to the Hall voltage. The offset voltage may reduce the detection accuracy of the magnetic field. In a sixth embodiment, the magnetic sensor that cancels the offset voltage will be described.

Figure 10:
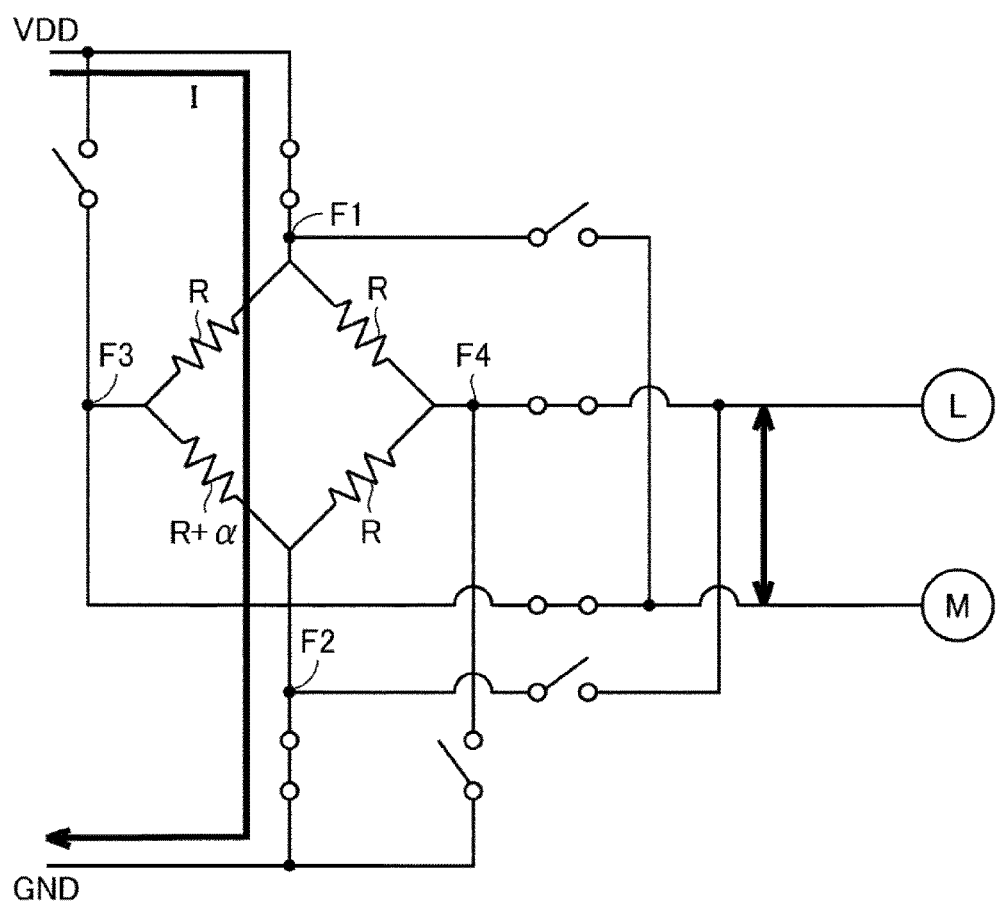
FIG. 10 is a diagram for describing cancelling of an offset voltage.
Figure 11:
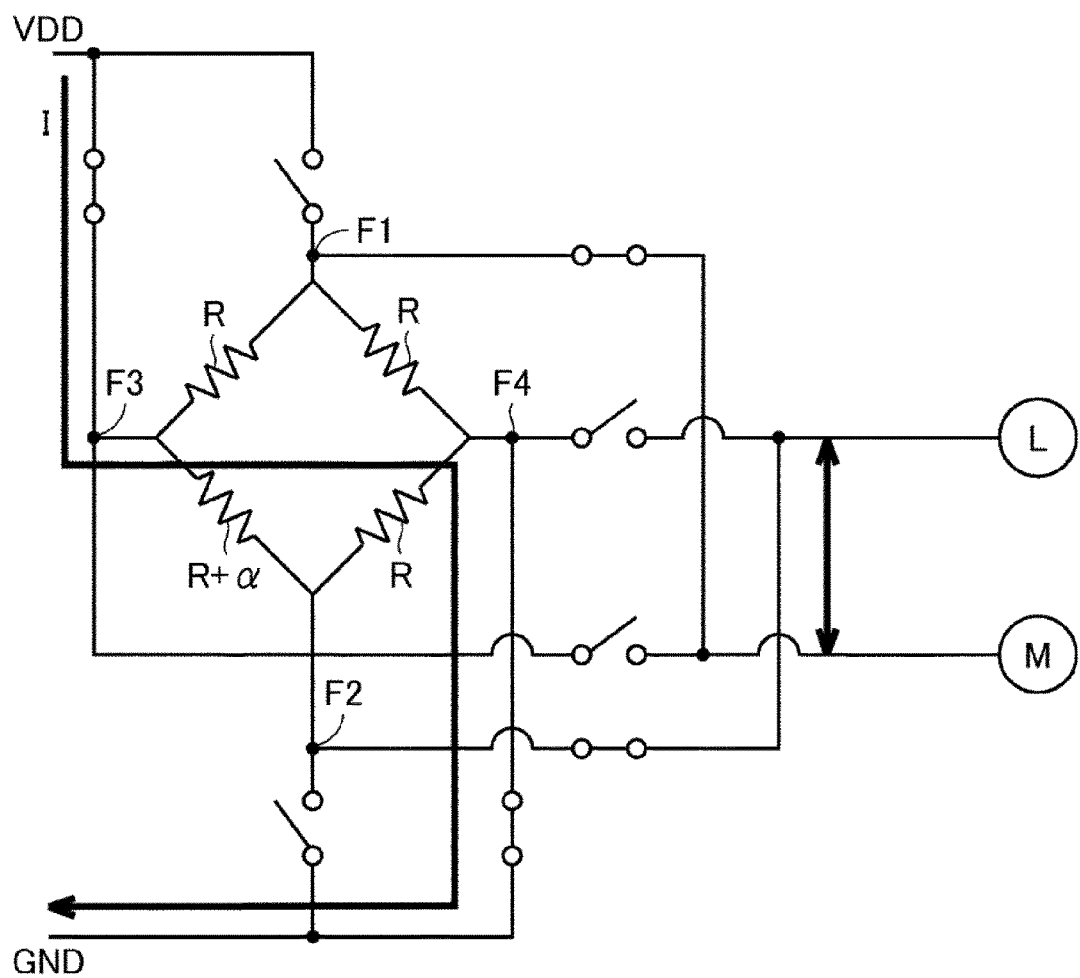
FIG. 11 is a diagram for describing cancelling of the offset voltage.

FIGS. 10 and 11 depict a bridge circuit equivalent to the Hall element. FIG. 10 depicts a case in which the drive current flows from VDD to GND through a point of contact F1 and a point of contact F2. FIG. 11 depicts a case in which the drive current flows from VDD to GND through a point of contact F3 and a point of contact F4. There is a difference of 90 degrees between FIGS. 10 and 11 in terms of direction of supply of drive current. The resistance values of three of four resistors included in the bridge circuit are R, and the resistance value of one resistor is R+α. Here, α represents an offset of the resistance value. In FIG. 10, the potential at a point L is as in the following formula (1), and the potential at a point M is as in the following formula (2). The potential difference between the point L and the point M is indicated by the following formula (3). In the following formulas, S represents the Hall voltage generated by the magnetic field.

[Math. 1]

$$VDD \times \frac{1}{2} \quad (1)$$

$$VDD \times \frac{R+\alpha}{2R+\alpha} \quad (2)$$

$$VDD \times \left(\frac{1}{2} - \frac{R+\alpha}{2R+\alpha}\right) + S \quad (3)$$

In FIG. 11, the potential at the point L is as in the following formula (4), and the potential at the point M is as in the following formula (5). The potential difference between the point L and the point M is indicated by the following formula (6).

[Math. 2]

$$VDD \times \frac{R}{2R+\alpha} \quad (4)$$

$$VDD \times \frac{1}{2} \quad (5)$$

$$VOD \times \left(\frac{R}{2R+\alpha} - \frac{1}{2}\right) - S \quad (6)$$

The difference between the voltage value of the formula (3) and the voltage value of the formula (6) is as in the following formula (7).

[Math. 3]

$$VDD \times \left(\frac{1}{2} - \frac{R+\alpha}{2R+\alpha}\right) + S - VDD \times \left(\frac{R}{2R+\alpha} - \frac{1}{2}\right) + S = \quad (7)$$

$$VDD \times \left(\frac{1}{2} + \frac{1}{2} - \frac{R+\alpha}{2R+\alpha} - \frac{R}{2R+\alpha}\right) + 2S =$$

$$VDD \times \left(1 - \frac{2R+\alpha}{2R+\alpha}\right) + 2S = 2S$$

As is clear from the formula (7), the difference between the formula (3) and the formula (6) can be calculated to cancel the resistance value corresponding to the offset voltage of the Hall element, and the value of the Hall voltage can be doubled.

The detection unit 602 and the current source 604 are connected in the switch circuit 608 used in the present embodiment (see FIG. 1). In the present embodiment, the switch circuit 608 can be controlled to make a switch between a first state and a second state. The second state is a state in which the drive electrodes in the first state serve as ground electrodes and in which the ground electrodes in the first state serve as drive electrodes.

Figure 12:
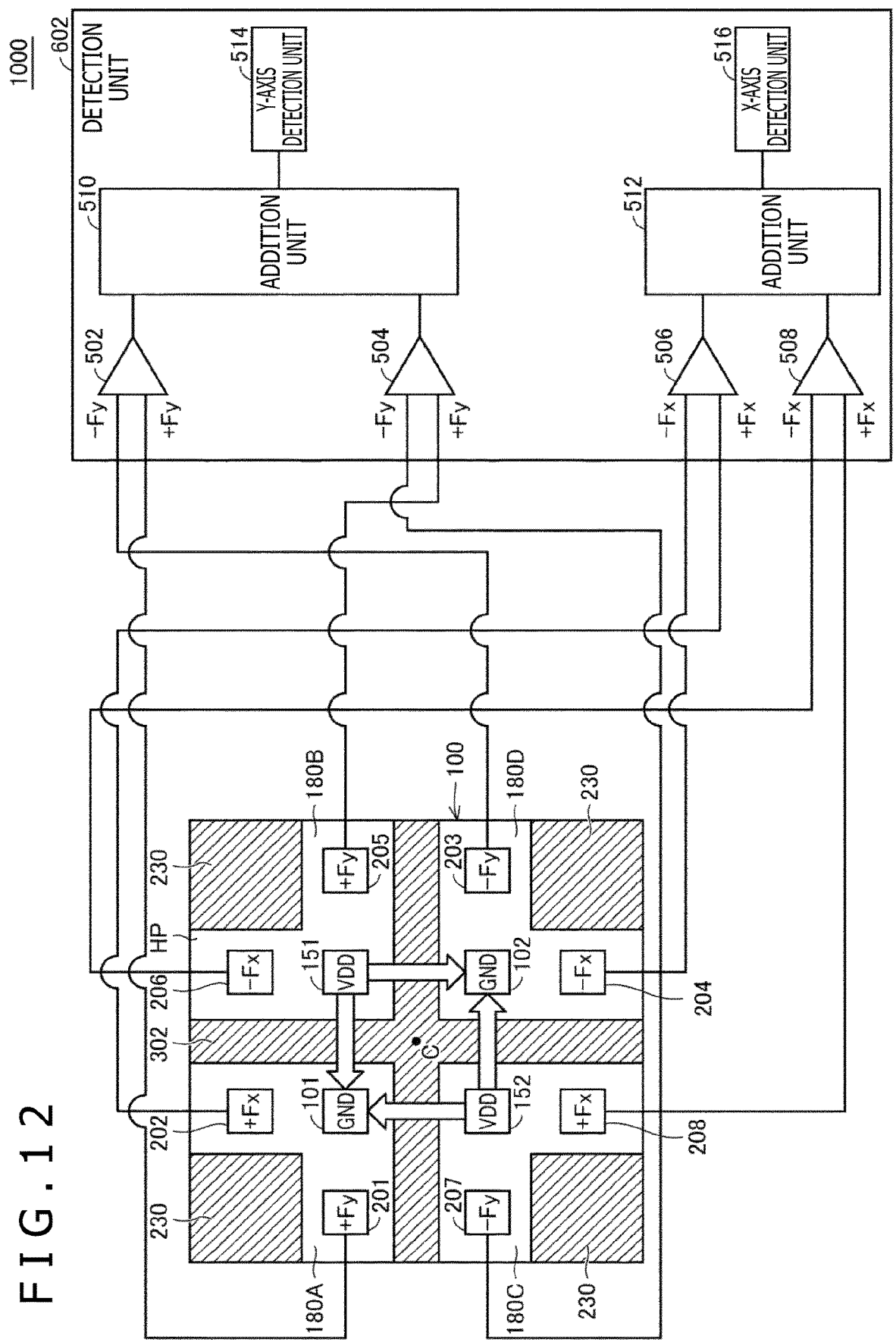
FIG. 12 depicts the Hall element and the control circuit according to another embodiment.

The first state is a state illustrated in FIGS. 3A to 3D and FIG. 4 (state corresponding to FIG. 10). FIG. 12 depicts the second state (state corresponding to FIG. 11). As illustrated in FIG. 12, the first drive electrode 101 and the second drive electrode 102 serve as a first ground electrode and a second ground electrode, respectively, and the first ground electrode 151 and the second ground electrode 152 serve as a first drive electrode and a second drive electrode, respectively, in the second state.

Further, the first drive electrode 101 corresponds to a "first electrode" in the embodiment of the present disclosure. The first ground electrode 151 corresponds to a "second electrode" in the embodiment of the present disclosure. The second ground electrode 152 corresponds to a "third electrode" in the embodiment of the present disclosure. The second drive electrode 102 corresponds to a "fourth electrode" in the embodiment of the present disclosure.

As illustrated in FIG. 4, the first state is a state in which the drive current supplied to the first electrode (first drive electrode 101) flows to the second electrode (first ground electrode 151) and the third electrode (second ground electrode 152) and in which the drive current supplied to the fourth electrode (second drive electrode 102) flows to the second electrode (first ground electrode 151) and the third electrode (second ground electrode 152).

As illustrated in FIG. 12, the second state is a state in which the drive current supplied to the second electrode (first ground electrode 151) flows to the first electrode (first drive electrode 101) and the fourth electrode (second drive electrode 102) and in which the drive current supplied to the third electrode (second ground electrode 152) flows to the first electrode (first drive electrode 101) and the fourth electrode (second drive electrode 102).

The Y-axis detection unit 514 stores, in a storage unit (not illustrated), the output value (Hall voltage) from the addition unit 510 in the first state and stores, in the storage unit, the output value (Hall voltage) from the addition unit 510 in the second state. The Y-axis detection unit 514 calculates the difference value between the output value from the addition unit 510 in the first state and the output value from the addition unit 510 in the second state. The Y-axis detection unit 514 detects the magnetic field in the Y-axis direction based on the difference value. The magnetic field in the Y-axis direction is a magnetic field in which the offset voltage is cancelled.

The X-axis detection unit 516 stores, in the storage unit, the output value (Hall voltage) from the addition unit 512 in the first state and stores, in the storage unit, the output value (Hall voltage) from the addition unit 512 in the second state. The X-axis detection unit 516 calculates the difference value between the output value from the addition unit 512 in the first state and the output value from the addition unit 512 in the second state. The X-axis detection unit 516 detects the magnetic field in the X-axis direction based on the difference value. The magnetic field in the X-axis direction is a magnetic field in which the offset voltage is cancelled.

In such a manner, the magnetic sensor of the sixth embodiment can switch one Hall element between the first state and the second state to detect the magnetic field in which the offset voltage is cancelled.

Seventh Embodiment

Figure 13:
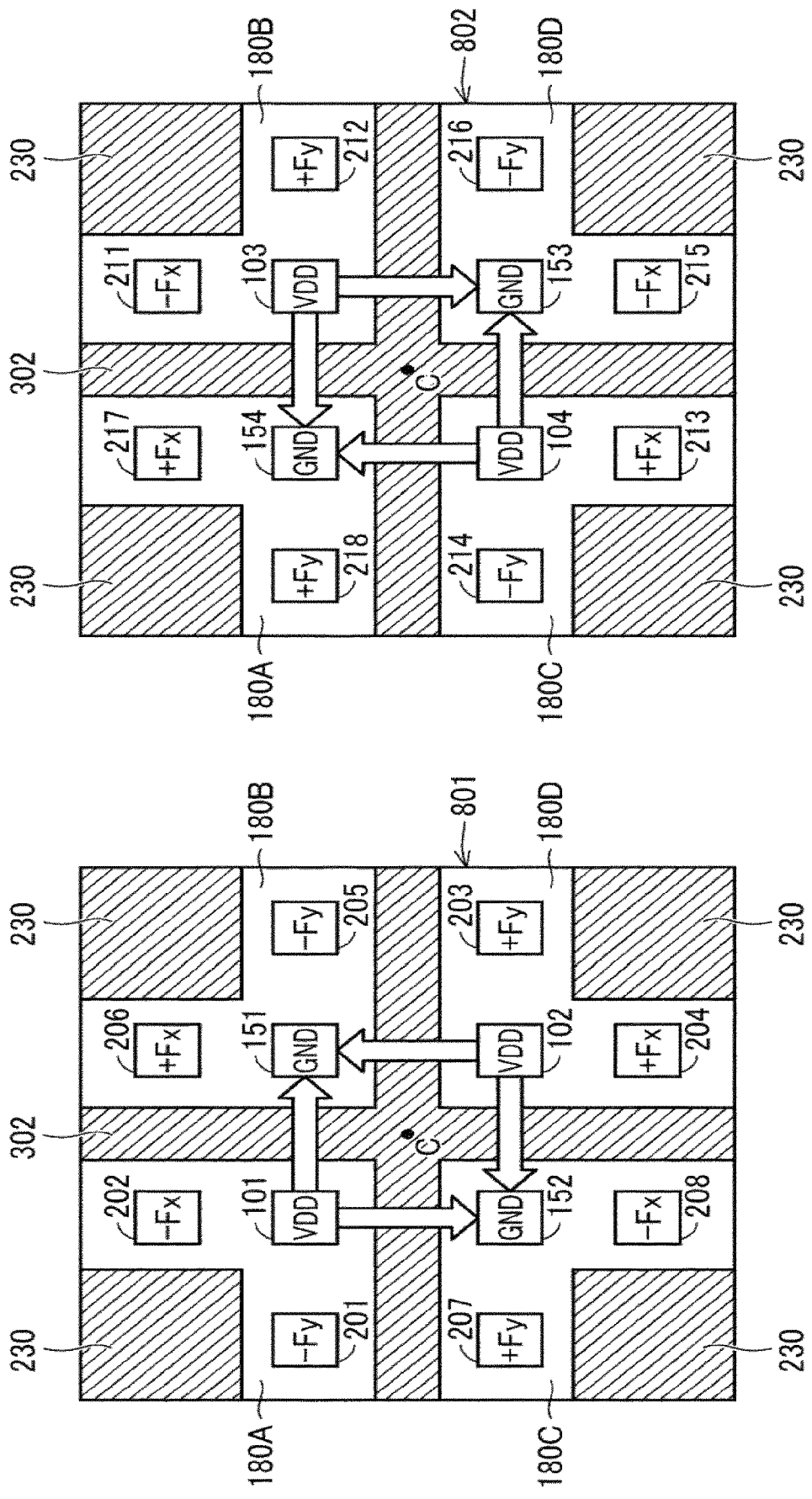
FIG. 13 depicts Hall elements according to another embodiment.
Figure 14:
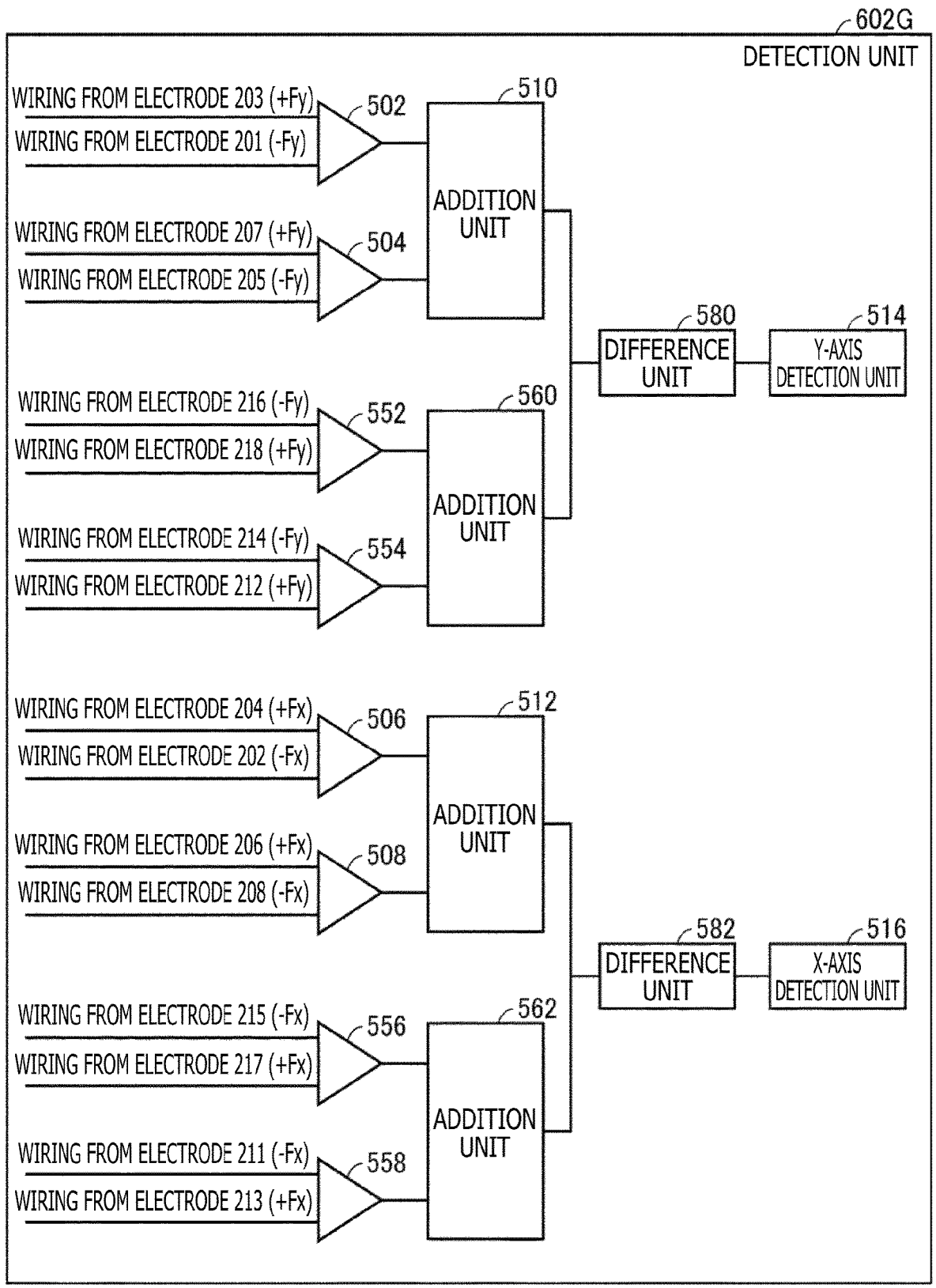
FIG. 14 depicts a control circuit according to the other embodiment.

In the configuration described in the sixth embodiment, one Hall element is switched to either the first state or the second state to detect the magnetic field in which the offset voltage is cancelled. The switch circuit is not included in the magnetic sensor of a seventh embodiment, and the magnetic sensor uses a Hall element in the first state and a Hall element in the second state to detect the magnetic field in which the offset voltage is cancelled. FIGS. 13 and 14 depict a configuration example of the magnetic sensor of the seventh embodiment. The magnetic sensor of the seventh embodiment includes a first Hall element 801, a second Hall element 802, and a control circuit including a detection unit 602G. FIG. 13 depicts the first Hall element 801 and the second Hall element 802, and FIG. 14 depicts the detection unit 602G. The configuration of the first Hall element 801 is the same as the configuration of the Hall element 100 in FIG. 2. The second Hall element 802 will be described below.

The second Hall element 802 includes a third drive electrode 103, a fourth drive electrode 104, a third ground electrode 153, a fourth ground electrode 154, an eleventh detection electrode 211, a twelfth detection electrode 212, a thirteenth detection electrode 213, a fourteenth detection electrode 214, a fifteenth detection electrode 215, a sixteenth detection electrode 216, a seventeenth detection electrode 217, and an eighteenth detection electrode 218. The "detection electrode group" described in FIG. 2 will also be referred to as a "first detection electrode group." Further, the eleventh detection electrode 211, the twelfth detection electrode 212, the thirteenth detection electrode 213, the fourteenth detection electrode 214, the fifteenth detection electrode 215, the sixteenth detection electrode 216, the seventeenth detection electrode 217, and the eighteenth detection electrode 218 will also comprehensively be referred to as a "second detection electrode group."

The third drive electrode 103 and the fourth drive electrode 104 are electrodes that receive the drive current under the control of the control unit 606. The third ground electrode 153 and the fourth ground electrode 154 are electrodes connected to the ground potential. The detection electrode group includes electrodes that detect the Hall voltage produced by the generated magnetic field.

Further, each set of the third drive electrode 103 and the fourth drive electrode 104, the third ground electrode 153 and the fourth ground electrode 154, the eleventh detection electrode 211 and the thirteenth detection electrode 213, the twelfth detection electrode 212 and the fourteenth detection electrode 214, the fifteenth detection electrode 215 and the seventeenth detection electrode 217, and the sixteenth detection electrode 216 and the eighteenth detection electrode 218 is at positions point-symmetric with respect to the center of gravity C.

The third ground electrode 153 is arranged separately in the negative direction of the Y-axis of the third drive electrode 103. The fourth ground electrode 154 is arranged separately in the negative direction of the X-axis of the third drive electrode 103. The fourth drive electrode 104 is arranged separately in the negative direction of the X-axis of the third ground electrode 153 and arranged separately in the negative direction of the Y-axis of the fourth ground electrode 154.

Further, the eleventh detection electrode 211 is arranged separately in the positive direction of the Y-axis of the third drive electrode 103. The twelfth detection electrode 212 is arranged separately in the positive direction of the X-axis of the third drive electrode 103. The thirteenth detection electrode 213 is arranged separately in the negative direction of the Y-axis of the fourth drive electrode 104. The fourteenth detection electrode 214 is arranged separately in the negative direction of the X-axis of the fourth drive electrode 104. The fifteenth detection electrode 215 is arranged separately in the negative direction of the Y-axis of the third ground electrode 153. The sixteenth detection electrode 216 is arranged separately in the positive direction of the X-axis of the third ground electrode 153. The seventeenth detection electrode 217 is arranged separately in the positive direction of the Y-axis of the fourth ground electrode 154. The eighteenth detection electrode 218 is arranged separately in the negative direction of the X-axis of the fourth ground electrode 154.

The second detection electrode group detects the Hall voltage generated according to the magnetic field, in a state in which the drive current flows from the third drive electrode 103 to the third ground electrode 153 and the fourth ground electrode 154 and in which the drive current flows from the fourth drive electrode 104 to the third ground electrode 153 and the fourth ground electrode 154.

Next, the connection relation between each electrode and the detection unit 602G will be described with reference to FIG. 14. The detection unit 602G includes amplifiers 502, 504, 506, 508, 552, 554, 556, and 558, addition units 510, 512, 560, and 562, difference units 580 and 582, the Y-axis detection unit 514, and the X-axis detection unit 516.

The sixteenth detection electrode 216 and the eighteenth detection electrode 218 are connected to the amplifier 552. The fourteenth detection electrode 214 and the twelfth detection electrode 212 are connected to the amplifier 554. The fifteenth detection electrode 215 and the seventeenth detection electrode 217 are connected to the amplifier 556. The eleventh detection electrode 211 and the thirteenth detection electrode 213 are connected to the amplifier 558.

The addition unit 560 adds the Hall voltage value amplified by the amplifier 552 (Hall voltage value corresponding to the magnetic field in the Y-axis direction in the second Hall element 802) and the Hall voltage value amplified by the amplifier 554 (Hall voltage value corresponding to the magnetic field in the Y-axis direction in the second Hall element 802).

The difference unit 580 calculates the difference value between the total value of the Hall voltages output from the addition unit 510 (Hall voltage value corresponding to the magnetic field in the Y-axis direction in the first Hall element 801) and the total value of the Hall voltages output from the addition unit 560 (Hall voltage value corresponding to the magnetic field in the Y-axis direction in the second Hall element 802). The difference value is a Hall voltage in the Y-axis direction in which the offset voltage is cancelled. The Y-axis detection unit 514 detects the magnetic field of the Y-axis based on the Hall voltage.

The addition unit 562 adds the Hall voltage value amplified by the amplifier 556 (Hall voltage value corresponding to the magnetic field in the X-axis direction in the second Hall element 802) and the Hall voltage value amplified by the amplifier 558 (Hall voltage value corresponding to the magnetic field in the X-axis direction in the second Hall element 802). Note that the process of the addition units 510 and 512 is similar to the process in FIG. 4.

The difference unit 582 calculates the difference value between the total value of the Hall voltages output from the addition unit 512 (Hall voltage value corresponding to the magnetic field in the X-axis direction in the first Hall element 801) and the total value of the Hall voltages output from the addition unit 562 (Hall voltage value corresponding to the magnetic field in the X-axis direction in the second Hall element 802). The difference value is a Hall voltage in the X-axis direction in which the offset voltage is cancelled. The X-axis detection unit 516 detects the magnetic field of the X-axis based on the Hall voltage.

In such a manner, the magnetic sensor of the seventh embodiment can detect the magnetic field in the X-axis direction and the Y-axis direction in which the offset voltage is cancelled.

The Hall element of the seventh embodiment requires two Hall elements, so that the size is larger than the magnetic sensor of the sixth embodiment, and the Hall element of the seventh embodiment does not require the switch circuit. The designer of the magnetic sensor can determine which one of the configuration of the sixth embodiment and the configuration of the seventh embodiment is to be adopted, according to the size of the apparatus and according to whether or not there is a switch circuit.

Hereinafter, "the relation between the Hall element in the first state and the Hall element in the second state" and "the relation between the first Hall element and the second Hall element" will also collectively be referred to as a "specific relation."

Eighth Embodiment

Figure 15:
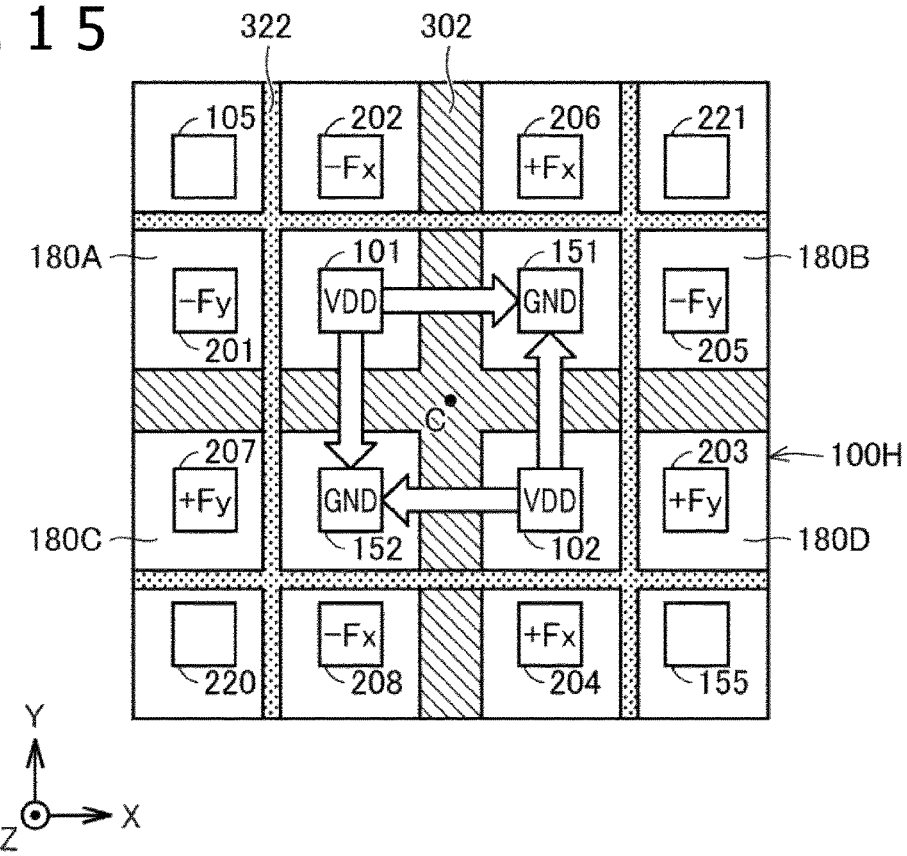
FIG. 15 is a plan view of a Hall element according to another embodiment from the Z-axis direction.

The magnetic field is detected in two directions (X-axis direction and Y-axis direction) in the Hall elements mainly described in the embodiments above. In a Hall element described in an eighth embodiment, the magnetic field can be detected in three directions (X-axis direction, Y-axis direction, and Z-axis direction). FIG. 15 depicts a configuration example of a Hall element 100H of the eighth embodiment. The Hall element 100H does not include the diffusion layer 230 at four corners formed in the Hall element 100 (see FIG. 2), and the Hall element 100H is provided with a contact region and an electrode at each of the four corners (that is, provided with four contact regions and four electrodes). The four electrodes include a fifth drive electrode 105, a fifth ground electrode 155, a twentieth detection electrode 220, and a twenty-first detection electrode 221. The twentieth detection electrode 220 and the twenty-first detection electrode 221 correspond to a "third electrode group" in the embodiment of the present disclosure. The diffusion layer 322 is provided in examples of FIG. 15 and FIG. 16 described later.

The fifth drive electrode 105 is arranged separately in the positive direction of the Y-axis of the first detection electrode 201 and arranged separately in the negative direction of the X-axis of the second detection electrode 202. The fifth ground electrode 155 is arranged separately on the negative direction side of the Y-axis of the third detection electrode 203 and in the positive direction of the X-axis of the fourth detection electrode 204. The twentieth detection electrode 220 is arranged separately on the negative direction side of the Y-axis of the seventh detection electrode 207 and in the negative direction of the X-axis of the eighth detection electrode 208. The twenty-first detection electrode 221 is arranged separately on the positive direction side of the Y-axis of the fifth detection electrode 205 and in the positive direction of the X-axis of the sixth detection electrode 206.

Figure 16:
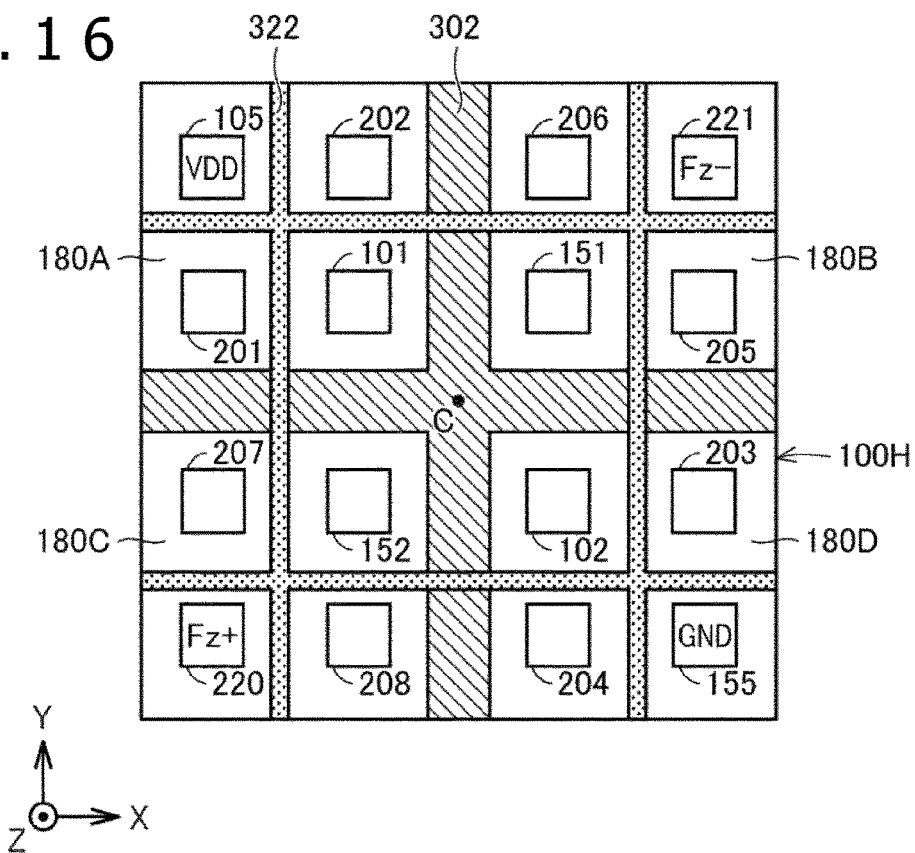
FIG. 16 is a plan view of the Hall element according to the other embodiment from the Z-axis direction.

In the present embodiment, the control circuit makes a switch between an X/Y-axis mode for detecting the magnetic field of the X-axis and the Y-axis and a Z-axis mode for detecting the magnetic field of the Z-axis. FIG. 15 depicts that the mode is switched to the X/Y-axis mode. FIG. 16 depicts that the mode is switched to the Z-axis mode. In the Z-axis mode, horizontal components of the drive current on the surface of the semiconductor substrate (for example, current flowing through the route I2 illustrated in FIGS. 3A to 3D) are used for the magnetic sensor to detect the magnetic field of the Z-axis.

As illustrated in FIG. 15, the X/Y-axis mode is a mode in which the drive current is supplied to the first drive electrode 101 and the second drive electrode 102 and in which the first ground electrode 151 and the second ground electrode 152 have ground potential. In addition, the X/Y-axis mode is a mode in which the drive current is not supplied to the fifth drive electrode 105 and in which the fifth ground electrode 155 does not have ground potential.

As illustrated in FIG. 16, the Z-axis mode is a mode in which the drive current is not supplied to the first drive electrode 101 and the second drive electrode 102 and in which the first ground electrode 151 and the second ground electrode 152 do not have ground potential. In addition, the Z-axis mode is a mode in which the drive current is supplied to the fifth drive electrode 105 and in which the fifth ground electrode 155 has ground potential. Therefore, the Z-axis mode is a mode in which the drive current supplied to the fifth drive electrode 105 flows to the fifth ground electrode 155 through the diffusion layer.

As illustrated in FIG. 16, when the magnetic field in the positive direction of the Z-axis is generated, a positive Hall voltage (+Fz) is detected by the twentieth detection electrode 220 due to the Hall effect based on the magnetic field in the Z-axis direction and the current of the horizontal components of the drive current (for example, current flowing through the route I2 illustrated in FIGS. 3A to 3D). When the magnetic field in the positive direction of the Z-axis is generated, a negative Hall voltage (−Fz) is detected by the twenty-first detection electrode 221 due to the Hall effect based on the magnetic field in the Z-axis direction and the current of the horizontal components of the drive current (for example, current flowing through the route I2 illustrated in FIGS. 3A to 3D).

Figure 17:
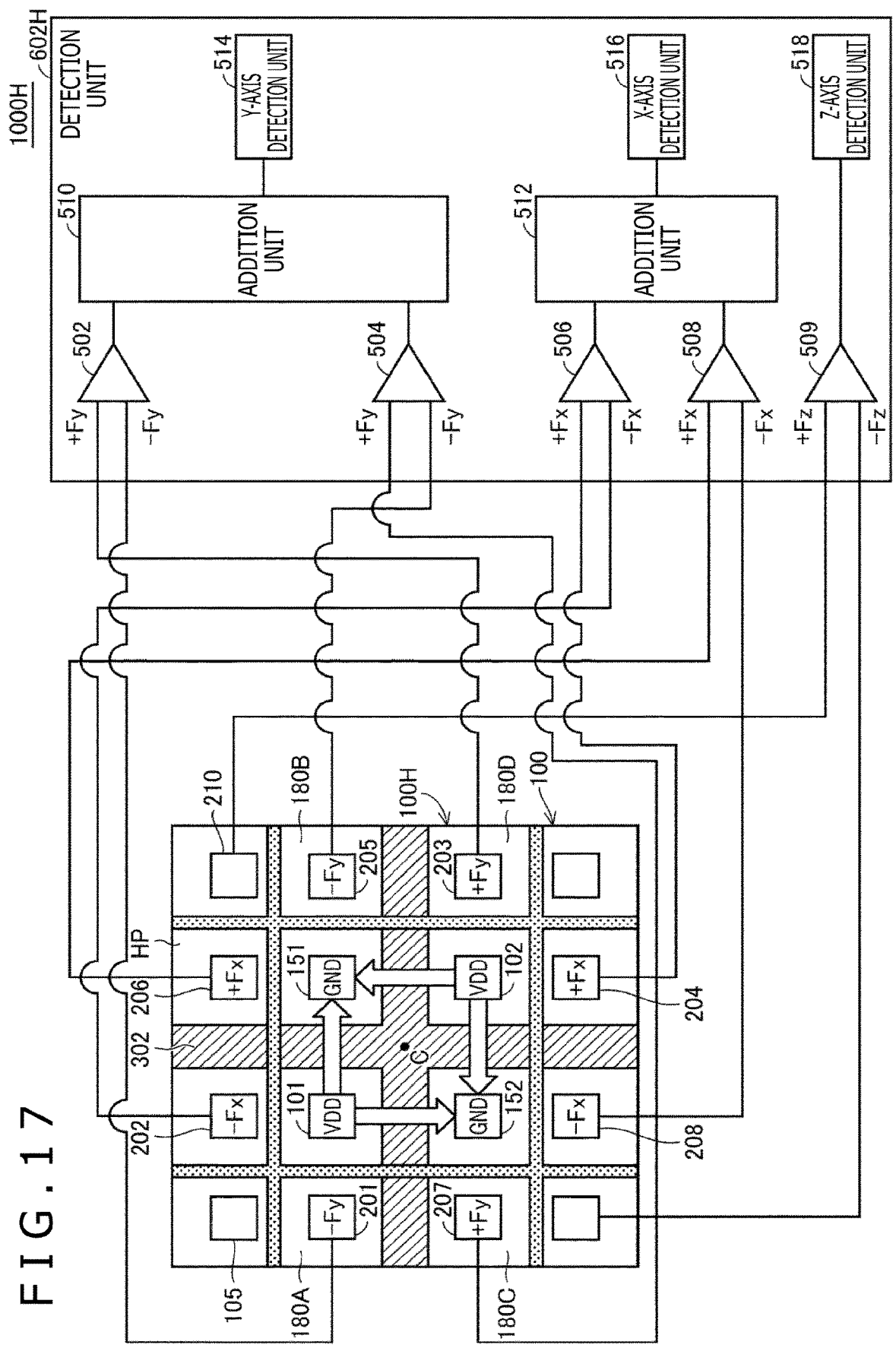
FIG. 17 depicts the Hall element and a control circuit according to the other embodiment.

FIG. 17 depicts a configuration example of a magnetic sensor 1000H of the present embodiment. As illustrated in FIG. 17, the magnetic sensor 1000H includes the Hall element 100H and a control circuit including a detection unit 602H. The twentieth detection electrode 220 and the twenty-first detection electrode 221 are connected to an amplifier 509. The amplifier 509 amplifies the Hall voltages detected by the twentieth detection electrode 220 and the twenty-first detection electrode 221 (Hall voltage corresponding to the magnetic field in the Z-axis direction). A Z-axis detection unit 518 detects the magnetic field of the Z-axis based on the Hall voltage value amplified by the amplifier 509.

In such a manner, the magnetic sensor 1000H of the present embodiment can detect the magnetic field of not only the X-axis and the Y-axis but also the Z-axis.

Figure 18:
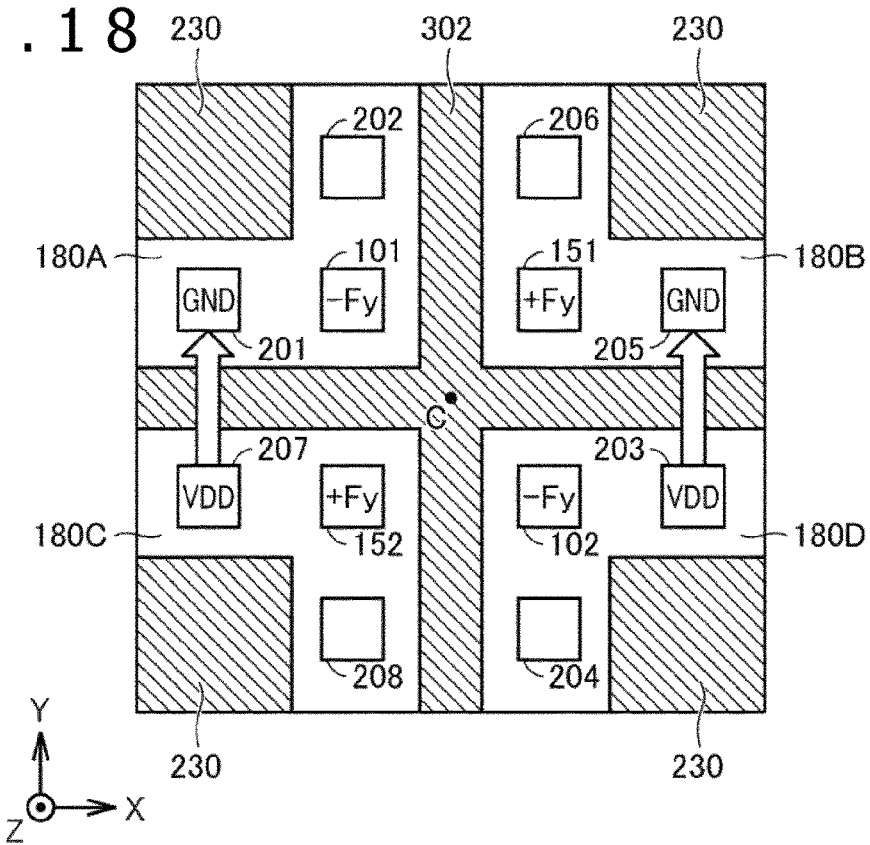
FIG. 18 is a plan view of a Hall element according to another embodiment from the Z-axis direction.

Other Embodiments (1) The magnetic sensor can detect the magnetic field not only when the electrodes are arranged as described above, but also when the electrodes are arranged in other ways. FIG. 18 depicts a mode of detecting the magnetic field of the Y-axis in another embodiment. While four inner electrodes provide the drive electrodes and the ground electrodes in the configuration illustrated in the example of FIG. 4, four outer electrodes provide the drive electrodes and the ground electrodes in the configuration illustrated in an example of FIG. 18.

Figure 19:
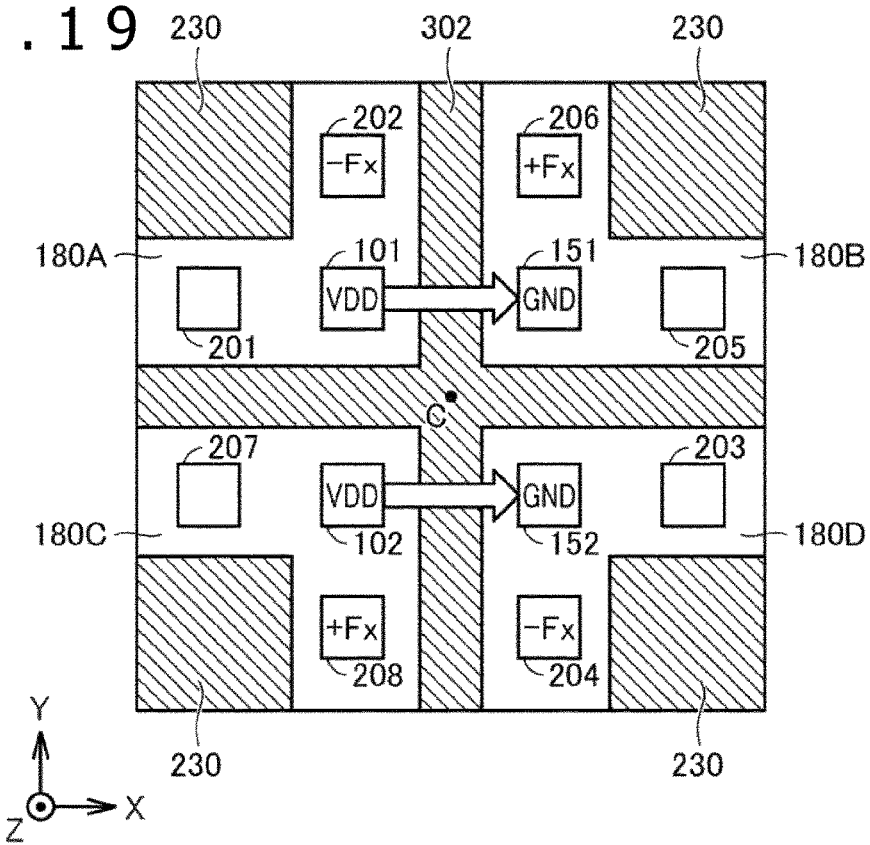
FIG. 19 is a plan view of a Hall element according to another embodiment from the Z-axis direction.
Figure 20:
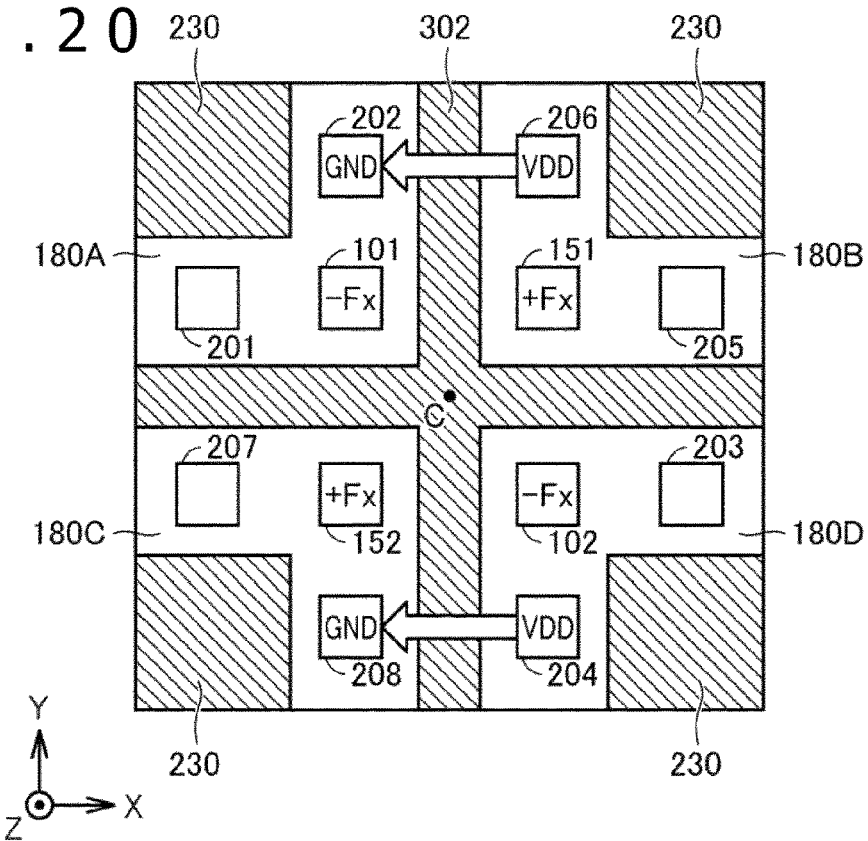
FIG. 20 is a plan view of a Hall element according to another embodiment from the Z-axis direction.

FIGS. 19 and 20 depict Hall elements in a mode of detecting the magnetic field of the X-axis without detecting the magnetic field of the Y-axis. Four inner electrodes provide the drive electrodes and the ground electrodes in the configuration illustrated in an example of FIG. 19, and four outer electrodes provide the drive electrodes and the ground electrodes in the configuration illustrated in an example of FIG. 20.

Figure 21:
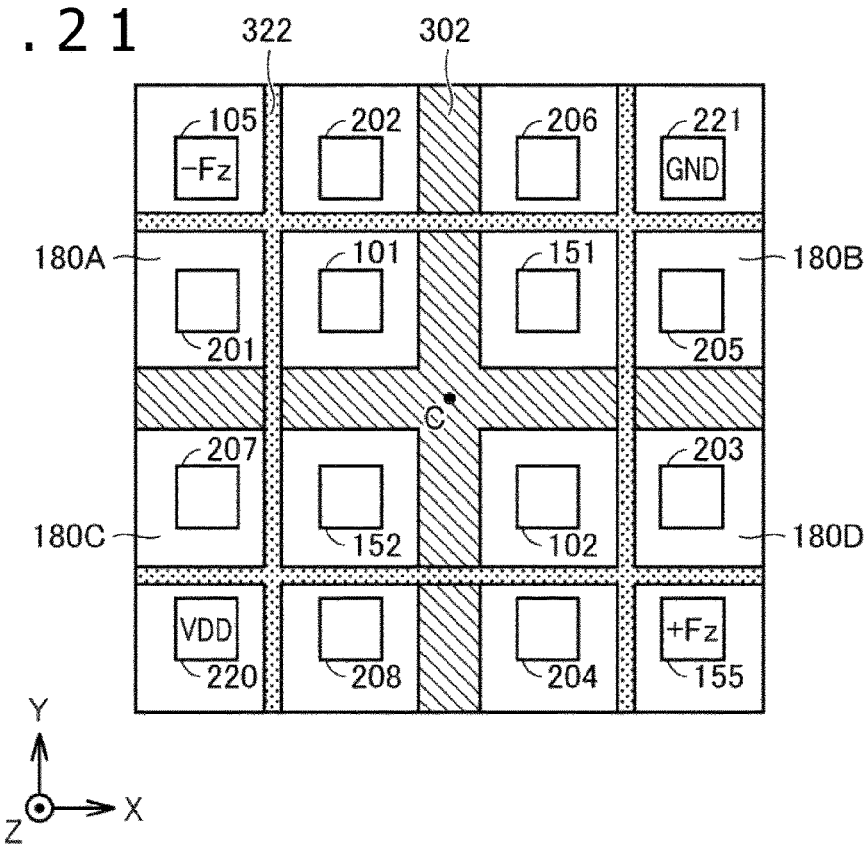
FIG. 21 is a plan view of a Hall element according to another embodiment from the Z-axis direction.

(2) FIG. 21 depicts a Hall element in the "specific relation" with the Hall element of FIG. 16. In the mode of detecting the magnetic field of the Z-axis, the control circuit can make a switch between the state of the Hall element illustrated in FIG. 16 and the state of the Hall element illustrated in FIG. 21 at a predetermined period to detect the magnetic field of the Z-axis in which the offset voltage is cancelled. The magnetic sensor includes the first Hall element illustrated in FIG. 16 and the second Hall element illustrated in FIG. 21, and this allows the magnetic sensor to detect the magnetic field of the Z-axis in which the offset voltage is cancelled.

Figure 22:
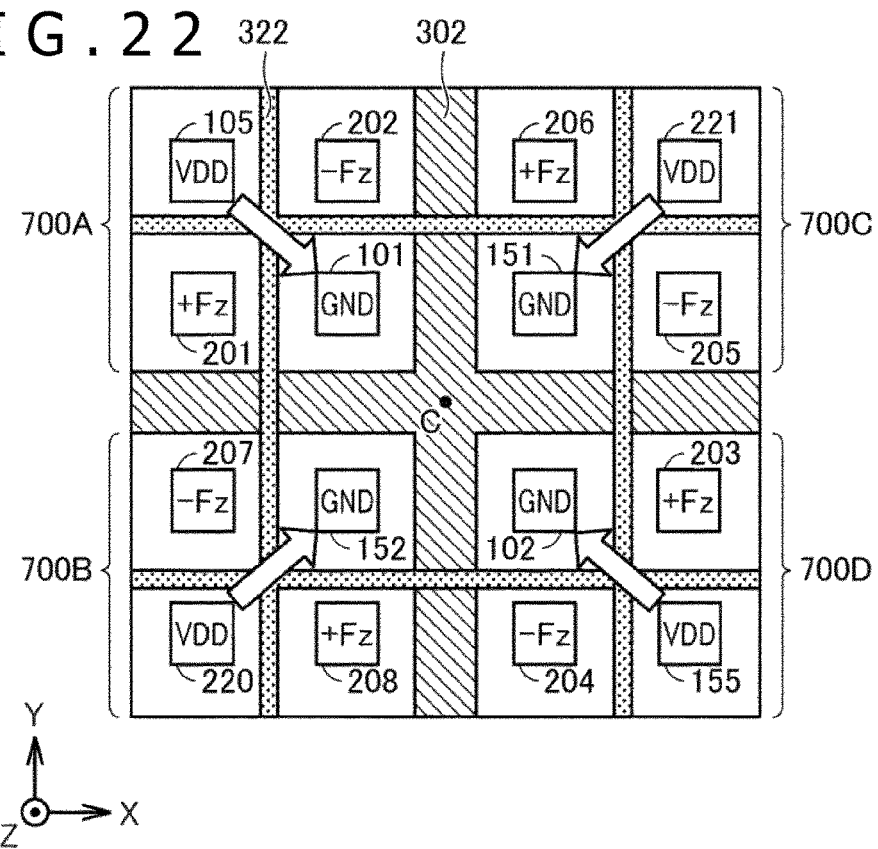
FIG. 22 is a plan view of a Hall element according to another embodiment from the Z-axis direction.

(3) In the configuration described in FIG. 16, the magnetic sensor includes one electrode group that detects the magnetic field of the Z-axis (fifth drive electrode 105, fifth ground electrode 155, twentieth detection electrode 220, and twenty-first detection electrode 221). However, the Hall element may include a plurality of electrode groups that detect the magnetic field of the Z-axis. FIG. 22 is a configuration example of a Hall element including four sets of electrode groups. In the example of FIG. 22, the Hall element includes four electrode groups 700A to 700D. Each of the four electrode groups 700A to 700D includes two drive electrodes and two detection electrodes. The configuration with a plurality of electrode groups that detect the magnetic field of the X-axis may also be adopted in the mode of detecting the magnetic field of the X-axis. The configuration with a plurality of electrode groups that detect the magnetic field of the Y-axis may also be adopted in the mode of detecting the magnetic field of the Y-axis.

Figure 23:
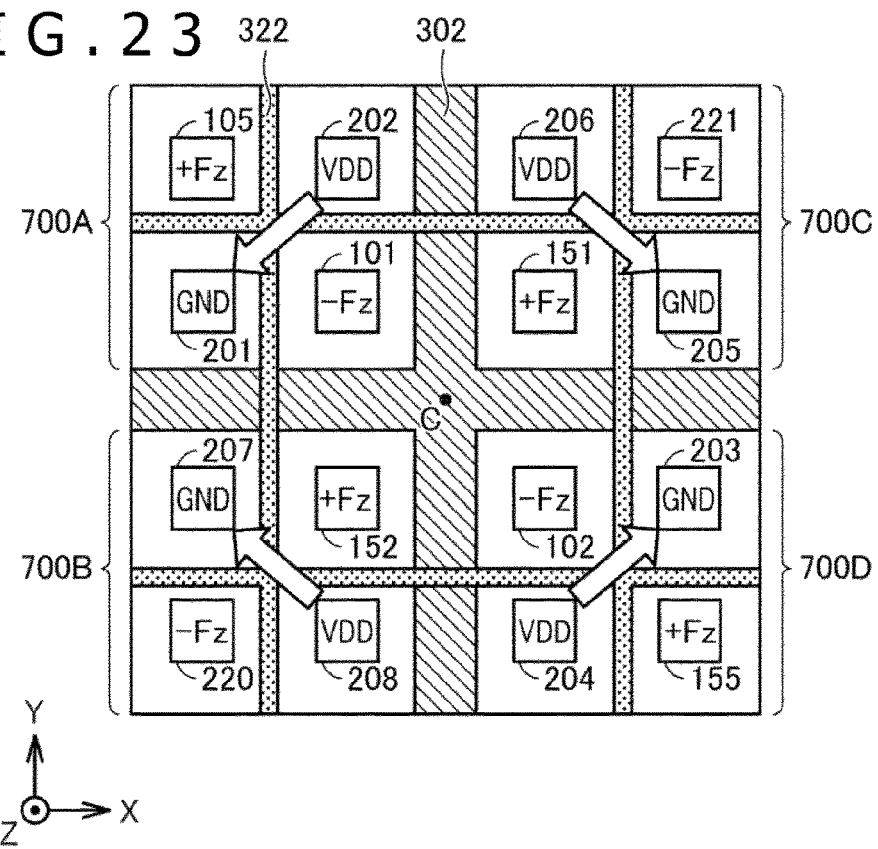
FIG. 23 is a plan view of a Hall element according to another embodiment from the Z-axis direction.

FIG. 23 depicts a Hall element in the "specific relation" with the Hall element illustrated in FIG. 22. The control circuit can make a switch between the state of the Hall element illustrated in FIG. 22 and the state of the Hall element illustrated in FIG. 23 at a predetermined period to detect the magnetic field of the Z-axis in which the offset voltage is cancelled.

Figure 24:
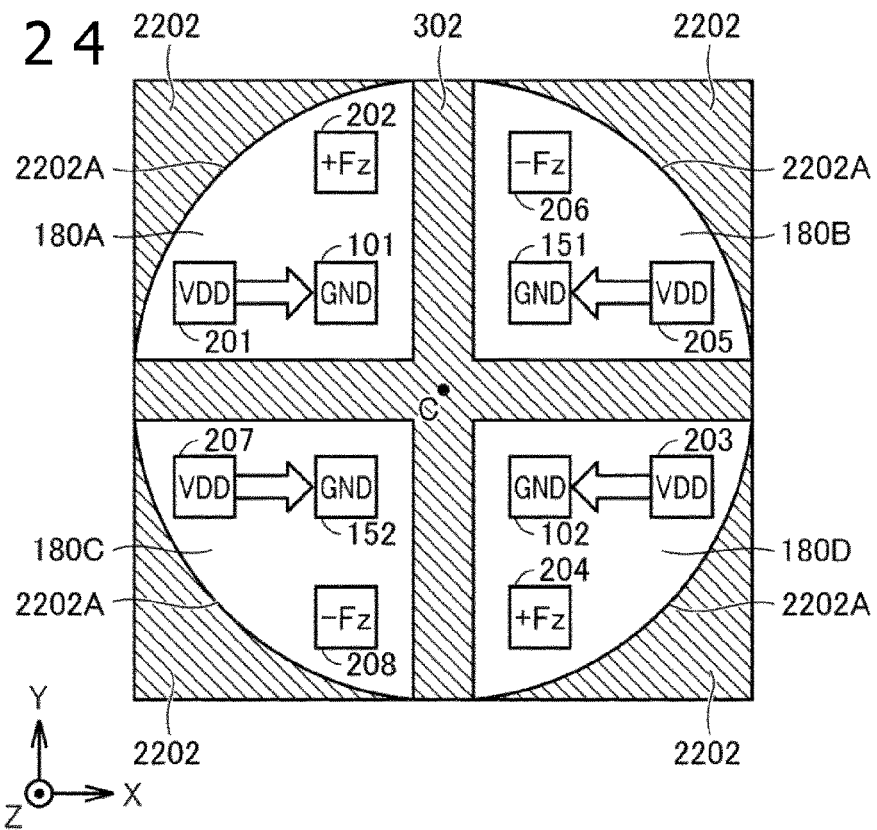
FIG. 24 is a plan view of a Hall element according to another embodiment from the Z-axis direction.
Figure 25:
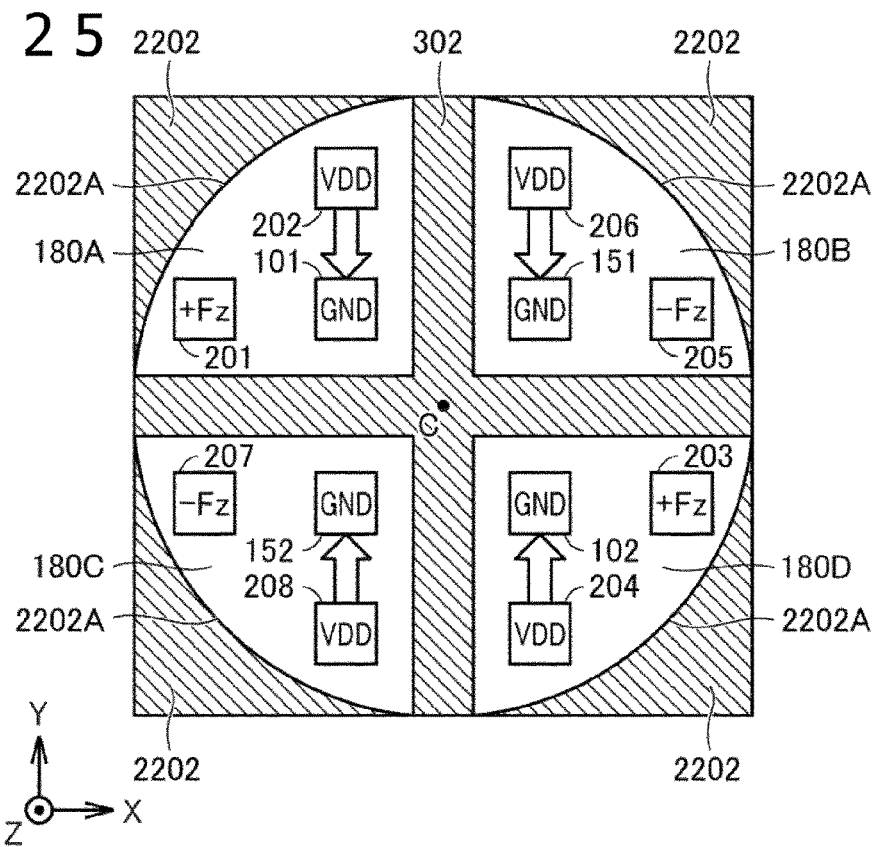
FIG. 25 is a plan view of a Hall element according to another embodiment from the Z-axis direction.

(4) In the example described in FIG. 15, the fifth drive electrode 105 and the fifth ground electrode 155 that detect the magnetic field of the Z-axis are newly provided to the Hall element 100 of FIG. 2. However, the magnetic field of the Z-axis may be detected without newly providing the fifth drive electrode 105 and the fifth ground electrode 155. FIG. 24 depicts a configuration example of a Hall element with this configuration. The magnetic sensor with the configuration of FIG. 24 can also detect the magnetic field of the Z-axis. FIG. 25 depicts a Hall element in the "specific relation" with the Hall element of FIG. 24. In the mode of detecting the magnetic field of the Z-axis, the control circuit can make a switch between the state of the Hall element illustrated in FIG. 24 and the state of the Hall element illustrated in FIG. 25 at a predetermined period to detect the magnetic field of the Z-axis in which the offset voltage is cancelled. Further, the magnetic sensor includes the first Hall element illustrated in FIG. 24 and the second Hall element illustrated in FIG. 25, and this allows the magnetic sensor to detect the magnetic field of the Z-axis in which the offset voltage is cancelled. Note that the configuration including the diffusion layer 2202 is adopted in the example of FIGS. 24 and 25.

Figure 26:
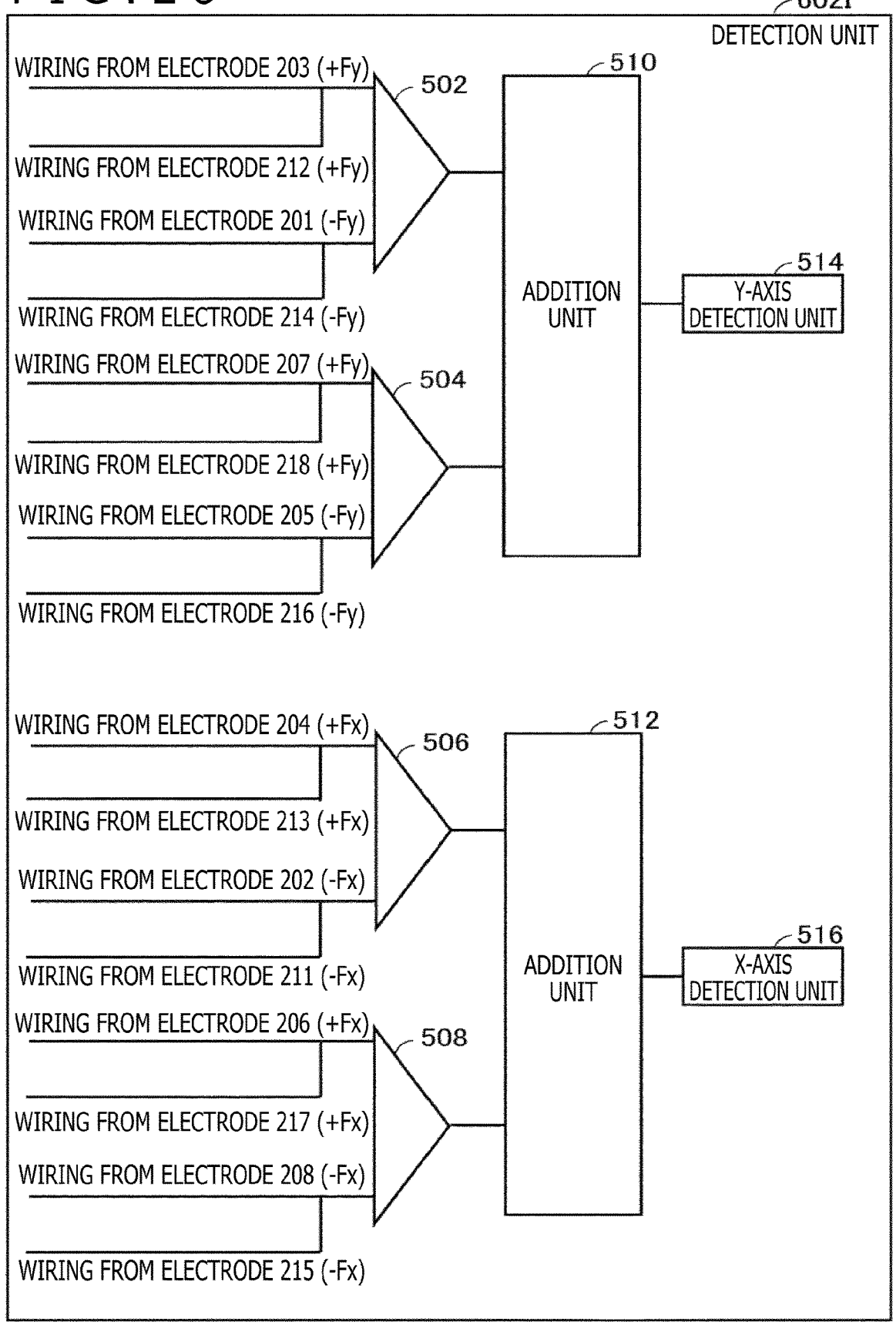
FIG. 26 depicts a control circuit according to another embodiment.

(5) The configuration of the detection unit 602G described in the seventh embodiment may be other configurations. FIG. 26 depicts a configuration of a detection unit 602I different from the detection unit 602G. Hereinafter, the electrodes of the first Hall element 801 and the second Hall element 802 in the same positional relation with respect to the drive electrodes or the ground electrodes will be referred to as "corresponding electrodes." The directions of the Hall voltages to be detected (positive direction of X-axis, negative direction of X-axis, positive direction of Y-axis, and negative direction of Y-axis) are the same in the corresponding electrodes. For example, the third detection electrode 203 of the first Hall element 801 and the twelfth detection electrode 212 of the second Hall element 802 are corresponding electrodes.

In the example of FIG. 26, the Hall voltages of the corresponding electrodes are averaged and input to one amplifier. In the example of FIG. 26, the wiring from the third detection electrode 203 and the wiring from the twelfth detection electrode 212 are connected to the amplifier 502. Therefore, the Hall voltage (+Fx) detected by the third detection electrode 203 and the Hall voltage (+Fx) detected by the twelfth detection electrode 212 are averaged to obtain a new Hall voltage (+Fx), and the new Hall voltage (+Fx) is input to the amplifier 502. The Hall voltages from other detection electrodes are similarly input to one amplifier.

The detection unit 602G may also be applied to the detection unit of the fifth embodiment that makes a switch between the first state and the second state.

In the detection unit 602G (see FIG. 14), the addition unit 510 adds, for example, the Hall voltages detected by the third detection electrode 203 and the first detection electrode 201 and the Hall voltages detected by the seventh detection electrode 207 and the fifth detection electrode 205. This can cancel the offset voltage while improving the sensitivity. On the other hand, the number of amplifiers can be reduced in the detection unit 602I (see FIG. 26). The designer of the magnetic sensor can determine which one of the detection unit 602G and the detection unit 602I is to be adopted, according to the detection accuracy and the number of amplifiers (that is, size of the apparatus of the magnetic sensor).

The embodiments disclosed here are illustrative in all aspects and should not be construed as restrictive. The scope of the present disclosure is indicated by the claims rather than the description of the embodiments, and all changes within the meaning and range of equivalents of the claims are intended to be included in the scope of the present disclosure.

What is claimed is:

1. A Hall element that detects a magnetic field, the Hall element comprising:
a substrate including a semiconductor region;
a first drive electrode arranged on the substrate;
a first ground electrode arranged on the substrate separately from the first drive electrode in a first direction;
a second ground electrode arranged on the substrate separately from the first drive electrode in a second direction different from the first direction;
wherein the second direction is orthogonal to the first direction;
a second drive electrode arranged on the substrate separately from the first ground electrode in the second direction and separately from the second ground electrode in the first direction;
a first insulation layer formed in a perpendicular direction from a surface of the substrate, wherein the first insulation layer divides the Hall element into a first region, a second region, a third region, and a fourth region, the first drive electrode is in the first region, the first ground electrode is in the second region, the second ground electrode is in the third region, the second drive electrode is in the fourth region, and
the first insulation layer is located between the first drive electrode and the first ground electrode in the first direction and between the first drive electrode and the second ground electrode in the second direction; and
a detection electrode group including a first electrode group that detects a Hall voltage generated by a first current including components perpendicular to the surface of the substrate, the first current flowing from the first drive electrode to the first ground electrode and the second ground electrode.

2. The Hall element according to claim 1, wherein the detection electrode group further includes a second electrode group that detects a Hall voltage generated by a second current including components perpendicular to the surface of the substrate, the second current flowing from the second drive electrode to the first ground electrode and the second ground electrode.

3. The Hall element according to claim 2, further comprising:
a third drive electrode arranged on the substrate; and
a third ground electrode arranged separately from the third drive electrode, wherein
the detection electrode group further includes a third electrode group that detects a Hall voltage generated by a third current including components parallel to the surface of the substrate, the third current flowing from the third drive electrode to the third ground electrode in the substrate.

4. The Hall element according to claim 1, further comprising:
a second insulation layer formed in the perpendicular direction from the surface of the substrate and formed between the first drive electrode and an electrode of the substrate, the electrode being included in the detection electrode group and being arranged adjacent to the first drive electrode,
wherein a depth of the second insulation layer from the surface of the substrate is shallower than a depth of the first insulation layer from the surface of the substrate.

5. The Hall element according to claim 4, wherein
the substrate is rectangular in plan view of the substrate from a normal direction, and
the Hall element further includes a third insulation layer formed in the perpendicular direction from the surface of the substrate and formed at four corners of the substrate.

6. The Hall element according to claim 5, wherein the third insulation layer at each corner is curved in a circumferential direction of the Hall element.

7. An electronic component, comprising:
the Hall element according to claim 1; and
a control circuit that controls the Hall element.

8. The Hall element according to claim 1, wherein the first electrode group includes:
a first electrode arranged on the substrate separately from the first drive electrode in a third direction opposite to the first direction, and
a second electrode arranged on the substrate separately from the first drive electrode in a fourth direction opposite to the second direction.

9. An electronic component, comprising:
a Hall element formed on a substrate including a semiconductor region; and a control circuit that detects a magnetic field acting on the Hall element, the Hall element including
a first electrode,
a second electrode arranged separately from the first electrode in a first direction,
a third electrode arranged separately from the first electrode in a second direction,
  wherein the second direction is orthogonal to the first direction,
a fourth electrode arranged separately from the second electrode in the second direction and arranged separately from the third electrode in the first direction,
a first insulation layer formed in a perpendicular direction from a surface of the substrate,
  wherein the first insulation layer is located between the first electrode and the second electrode in the first direction and between the first electrode and the third electrode in the second direction that is orthogonal to the first direction, and
a detection electrode group, wherein
  the detection electrode group
    detects a Hall voltage generated in a first state in which a first current including components perpendicular to the surface of the substrate flows from the first electrode to the second electrode and the third electrode and in which a second current including components perpendicular to the surface of the substrate flows from the fourth electrode to the second electrode and the third electrode, and
    detects a Hall voltage generated in a second state in which a third current including components perpendicular to the surface of the substrate flows from the second electrode to the first electrode and the fourth electrode and in which a fourth current including components perpendicular to the surface of the substrate flows from the third electrode to the first electrode and the fourth electrode, and
  the control circuit detects the magnetic field acting on the Hall element, based on a difference between the Hall voltage detected in the first state and the Hall voltage detected in the second state.

10. An electronic component, comprising:
a first Hall element and a second Hall element formed on a substrate including a semiconductor region; and
a control circuit that detects a magnetic field acting on the first Hall element and the second Hall element,
the first Hall element including
a first drive electrode,
a second drive electrode,
a first ground electrode arranged separately from the first drive electrode in a first direction and arranged separately from the second drive electrode in a second direction different from the first direction,
  wherein the second direction is orthogonal to the first direction;
a second ground electrode arranged separately from the first drive electrode in the second direction and arranged separately from the second drive electrode in the first direction,
a first insulation layer formed in a perpendicular direction from a surface of the substrate, wherein
the first insulation layer divides the first Hall element into a first region, a second region, a third region, and a fourth region,
the first drive electrode is in the first region,
the first ground electrode is in the second region,
the second ground electrode is in the third region,
the second drive electrode is in the fourth region, and
the first insulation layer is located between the first drive electrode and the first ground electrode in the first direction and between the first drive electrode and the second ground electrode in the second direction, and
a first detection electrode group that detects a Hall voltage generated in a state in which a first current including components perpendicular to the surface of the substrate flows from the first drive electrode to the first ground electrode and the second ground electrode and in which a second current including components perpendicular to the surface of the substrate flows from the second drive electrode to the first ground electrode and the second ground electrode, the second Hall element including
a third drive electrode,
a fourth drive electrode,
a third ground electrode arranged separately from the third drive electrode in the second direction and arranged separately from the third drive electrode in the first direction,
a fourth ground electrode arranged separately from the third drive electrode in the first direction and arranged separately from the fourth drive electrode in the second direction, and
a second detection electrode group that detects a Hall voltage generated in a state in which a third current including components perpendicular to the surface of the substrate flows from the third drive electrode to the third ground electrode and the fourth ground electrode and in which a fourth current including components perpendicular to the surface of the substrate flows from the fourth drive electrode to the third ground electrode and the fourth ground electrode,
wherein the control circuit detects the magnetic field acting on the first Hall element and the second Hall element, based on a difference between the Hall voltage detected by the first detection electrode group and the Hall voltage detected by the second detection electrode group.

* * * * *